United States Patent
Simula et al.

(10) Patent No.: US 10,225,932 B1
(45) Date of Patent: Mar. 5, 2019

(54) INTERFACING ARRANGEMENT, METHOD FOR MANUFACTURING AN INTERFACING ARRANGEMENT, AND MULTILAYER STRUCTURE HOSTING AN INTERFACING ARRANGEMENT

(71) Applicant: TactoTek Oy, Oulunsalo (FI)

(72) Inventors: Tomi Simula, Oulunsalo (FI); Vinski Bräysy, Oulunsalo (FI); Mikko Heikkinen, Oulunsalo (FI); Juha-Matti Hintikka, Oulunsalo (FI); Minna Pirkonen, Oulunsalo (FI); Pasi Raappana, Oulunsalo (FI); Tuomas Heikkilä, Oulunsalo (FI); Jarmo Sääski, Oulunsalo (FI); Juhani Harvela, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

(21) Appl. No.: 16/113,555

(22) Filed: Aug. 27, 2018

(51) Int. Cl.
| | | |
|---|---|---|
| H05K 5/00 | (2006.01) | |
| H05K 7/00 | (2006.01) | |
| H05K 1/14 | (2006.01) | |
| H05K 1/11 | (2006.01) | |
| H01R 12/71 | (2011.01) | |
| H05K 1/02 | (2006.01) | |
| H05K 1/18 | (2006.01) | |

(52) U.S. Cl.
CPC ............ *H05K 1/11* (2013.01); *H01R 12/712* (2013.01); *H05K 1/0204* (2013.01); *H05K 1/185* (2013.01); *H05K 2201/066* (2013.01); *H05K 2201/09118* (2013.01)

(58) Field of Classification Search
CPC ........ H05K 1/11; H05K 1/0204; H05K 1/185; H05K 1/18; H05K 1/181; H05K 1/182; H05K 1/183; H05K 1/184; H01R 12/712; H01R 12/00
USPC .......... 361/679.01, 728, 736, 746, 750, 751, 361/757, 739
See application file for complete search history.

(56) References Cited

U.S. PATENT DOCUMENTS

| | | | | |
|---|---|---|---|---|
| 6,837,719 B2* | 1/2005 | Panella | ............... | H05K 1/0262 439/67 |
| 7,187,071 B2* | 3/2007 | Tsuneoka | ............... | H01L 24/97 257/207 |
| 7,587,817 B2* | 9/2009 | Williams | ............. | H01R 12/526 29/874 |

(Continued)

*Primary Examiner* — Anthony M Haughton
(74) *Attorney, Agent, or Firm* — Robert P. Michal, Esq.; Carter, DeLuca, Farrell & Schmidt LLP

(57) ABSTRACT

Interface arrangement comprising an electrical node type component for providing electrical or electromagnetic connection between an external system and a host structure of the interface arrangement. The interface arrangement comprising a first substrate film defining a cavity. A first material layer arranged to at least partly fill the cavity and to embed or at least partly cover at least one electrical element at least partly arranged into the cavity. The at least one electrical element comprises at least a converter element configured for adapting signals to be transferred between the external system and electronics of the host structure. A first connection element arranged at least partly into the cavity and configured for connecting to the external system. The first connection element is further at least functionally connected to the converter element. Related multilayer structures and methods of manufacture are presented.

20 Claims, 10 Drawing Sheets

(56) References Cited

U.S. PATENT DOCUMENTS

| | | | | |
|---|---|---|---|---|
| 7,597,561 | B2* | 10/2009 | Radza | H01L 24/72 |
| | | | | 439/66 |
| 7,628,617 | B2* | 12/2009 | Brown | H01R 13/2407 |
| | | | | 439/66 |
| 8,787,022 | B2* | 7/2014 | Moriai | G06F 1/20 |
| | | | | 174/260 |
| 8,829,667 | B2* | 9/2014 | Park | H01L 23/552 |
| | | | | 257/692 |
| 2003/0194832 | A1* | 10/2003 | Lopata | H01L 23/49805 |
| | | | | 438/108 |
| 2004/0225462 | A1* | 11/2004 | Renken | H01L 21/67253 |
| | | | | 702/94 |
| 2005/0224946 | A1* | 10/2005 | Dutta | G02B 6/12002 |
| | | | | 257/686 |
| 2011/0309236 | A1* | 12/2011 | Tian | H01L 27/14603 |
| | | | | 250/208.1 |
| 2017/0082167 | A1* | 3/2017 | Donzelli | F16D 66/00 |
| 2017/0187100 | A1* | 6/2017 | Fotheringham | H01Q 1/2291 |

* cited by examiner

INTERFACING ARRANGEMENT, METHOD FOR MANUFACTURING AN INTERFACING ARRANGEMENT, AND MULTILAYER STRUCTURE HOSTING AN INTERFACING ARRANGEMENT

FIELD OF THE INVENTION

The present invention relates in general to electronic assemblies. In particular, however not exclusively, the present invention concerns interfacing arrangements, such as of electrical interfaces, for providing connection between an external system and an electronic structure, particularly structure including a molded or casted material layer.

BACKGROUND

There exists a variety of different stacked assemblies and structures in the context of electronics and electronic products. The motivation behind the integration of electronics and related products may be as diverse as the related use contexts. Relatively often size savings, weight savings, cost savings, or just efficient integration of components is sought for when the resulting solution ultimately exhibits a multilayer nature. In turn, the associated use scenarios may relate to product packages or food casings, visual design of device housings, wearable electronics, personal electronic devices, displays, detectors or sensors, vehicle interiors, antennae, labels, vehicle electronics, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, and inkjet printing, through a substantially additive printing process. The used substrates may be flexible and printed materials organic, which is however, not always the case.

Furthermore, the concept of injection molded structural electronics (IMSE) actually involves building functional devices and parts therefor in the form of a multilayer structure, which encapsulates electronic functionality as seamlessly as possible. Characteristic to IMSE is also that the electronics is commonly manufactured into a true three-dimensional (3D) (i.e., non-planar) form in accordance with the 3D models of the overall target product, part or generally design. To achieve desired 3D layout of electronics on a 3D substrate and in the associated end product, the electronics may be still provided on an initially planar substrate, such as a film, using two dimensional (2D) methods of electronics assembly, whereupon the substrate, already accommodating the electronics, may be formed into a desired 3D shape and subjected to overmolding, for example, by suitable plastic material that covers and embeds the underlying elements such as electronics, thus protecting and potentially hiding the elements from the environment.

In typical solutions, electrical circuits have been produced on a printed circuit board (PCB) or a on substrate film, after which they have been overmolded by plastic material. Known structures and methods have, however, some drawbacks, still depending on the associated use scenario. In order to produce an electronic assembly having one or more functionalities, typically rather complex electrical circuits for achieving these functionalities have to be produced on a substrate by printing and/or utilizing SMDs, and then be overmolded by plastic material. However, in the known solutions, the implementation of complex functionalities may face reliability risks and assembly yield issues arising from challenges in integrating very dense components and components with complex geometries. Furthermore, the electronic assembly may require, for example, the use of external control electronics which reduces degree of integration and makes the structures less attractive. Directly integrating dense components and components of complex geometry can be challenging and potentially very risky, as reliability will often be affected by molding pressure, for instance, and the assembly yields in different production phases can be very low. Subassemblies mounted or arranged on a PCB and covered with a plastic layer can suffer from mismatch in thermal expansion coefficients, be difficult to be overmolded due to their complex structure, and exhibit stresses in the structure which can tear the subassemblies off their electrical contacts. Challenges in thermal management may also generally cause issues such as overheating.

Many IMSE designs have e.g. individually connected all electrical signals out of the IMSE part or device, most often with a flexible circuit board tail ("flex") bonded on an IMSE substrate with ACA (anisotropically conductive adhesive). A contemporary approach for IMSE connections is indeed to bring all the electrical connections out of the part or the device, and the part may easily have ten(s) or more signals to be brought out. Electrical connections between an IMSE structure and an external system may generally involve or implement power transfer (voltage/current supply) and/or data transfer (control and/or other data) in either direction. Furthermore, the system-facing connectivity has varied widely, for example, with only a selected bus type power convection arranged in some implementations and e.g. a network connection in others.

For example, "flex" type connection has proven challenging to implement in a reliable fashion in various use contexts while still maintaining a modicum of production automation as typically manual labor has been found necessary. On the other hand, many mechanically better (durable, secure, etc.) and more automation-friendly connectors have not been able to reach the desired connection density for bringing all electrical and power signals/connections out of the part. Therefore, there is still a need to develop solutions for interfacing various external systems with various IMSE parts or devices, the solutions being, besides robust and versatile, also more automation-friendly.

SUMMARY

The present invention is realized by various embodiments of an interface arrangement, or interfacing arrangement, a method for manufacturing the interface arrangement, and a multilayer structure hosting the interface arrangement in accordance with the principles of the present invention. Particularly, the objectives are reached by an interface arrangement, a method of manufacture and a multilayer structure as defined by the respective independent claims.

According to a first aspect, an interface arrangement, optionally being or comprising an essentially electrical or electronic component, such as an embodiment of an electrical node discussed hereinlater, for providing connection between an external system and a host structure of the interface arrangement is provided. The interface arrangement advantageously comprises a first substrate film defining a cavity, a first material layer arranged to at least partly fill the cavity, and to embed or at least partly cover at least one electrical element at least partly arranged into the cavity, wherein the at least one electrical element comprises at least one converter element configured for adapting signals, such as power, control and/or (other besides strictly control) data signals, to be transferred between said external system and electronics of the host structure, and a first connection, or connecting, element preferably arranged at least partly into the cavity and configured for connecting to the external system, wherein the first connection element is at least functionally connected to the converter element.

In various embodiments, the cavity may define or exhibit a shape of, for example having regard to its cross-section, section and/or overall shape, substantially rectangular, dome-shaped, rounded, hemispherical, truncated cone, and/or other preferred shape(s).

In various preferred embodiments, the interface arrangement may be realized or considered as a component, or (smart) connector, type of an element physically provided on the side of the host structure and configured to interface the electrical or electronic features of the external system (comprising e.g. one or more external devices and/or structures) with the electrical or electronic features of the host structure. The arrangement may, in its many embodiments, be electromechanical having regard to both connection sides (external system vs. host device/IMSE structure) or rely upon a wireless connectivity at least on one side of the interface as to be deliberated in further detail hereinafter. The connectivity towards either system (external vs. host structure) may, still depending on the embodiment, at least selectively, if not fully, follow on a selected communication interface standard as to e.g. mechanical aspects, considering e.g. mechanical connector type and further e.g. pin/signal division therein, and/or electrical aspects (e.g. power signal, control (data) signal and/or (other) data signal specifications) thereof.

In various embodiments, a substrate film such as the first substrate film refers herein to a substrate in which one (e.g. z, such as "thickness") of the three dimensions is significantly shorter with respect to the other two (e.g. x and y) dimensions. The film substrate may, at least originally, be essentially planar or planar-like substrate. However, it may be formed to establish an essentially three-dimensional, or at least more three-dimensional, shape as discussed hereinafter.

In various preferred embodiments, the converter element may essentially refer to a single element, such as a component, comprising e.g. integrated circuit, or a system of several elements including e.g. multiple components and/or elements, which are at least functionally connected together using e.g. electrical conductors to functionally establish the converter element as discussed herein. Preferably at least one constituent portion of the converter element, e.g. one or more elements or components thereof, or a portion of a single element or component, is arranged into the cavity. Yet, in the cavity, it may be embedded or covered by the fill material.

In various preferred embodiments, the arrangement comprises at least one second connection element, preferably provided with a number of electrical conductors and/or contacts, arranged for connecting, preferably attaching, to the host structure and at least functionally connected to the converter element. The second connection element enables power, control or (other) data transfer using e.g. electrical signals between the interface (and specifically converter element therein) and at least selected remaining electronics of the host structure in accordance with a selected communication and/or power transfer scheme and related specifications (specifying e.g. the number and type of transferred signals, such as voltages, pulse lengths, modulation, etc.).

In various embodiments, the interface may comprise the at least one electrical element being at least partially printed, such as screen printed or inkjet printed, on the first substrate film and into the cavity. Instead of or in addition to printing, attaching of at least partially ready-made element, such as mounting of an electronic component, may be performed.

In various embodiments, as alluded to above, the adaptation may refer to signal transformation, voltage conversion, current conversion, power conversion, power conditioning, signal path adaptation, signal path migration, signal path connecting, signal path separation, signal selection, signal amplification, signal attenuation, voltage limiting, current limiting, and/or signal filtering, for instance. The adaptation may be executed by the converter element and optionally also by a number of further elements included in the interface arrangement. For example, the first and/or second connection elements may contain at least limited functionality for adapting purposes.

In various embodiments, the signals comprise at least one element selected from the group consisting of: electrical signal, electromagnetic signal, optical signal, current, voltage, power signal, digital signal, analogue signal, analogue electrical signal, digital electrical signal, control signal and (other) data signal.

In various embodiments, the arrangement comprises a second substrate, such as a printed circuit board, ceramic electrical substrate, (printed) film substrate or patterned conductive polymer substrate, comprising one or more electrical elements of the at least one electrical element, wherein the second substrate may be optionally further arranged so that said one or more electrical elements of the at least one electrical element is positioned into the cavity and embedded in or at least partly covered by the first material layer.

In various embodiments, the arrangement comprises a second material layer arranged on the at least one electrical element for reducing undesired air pockets (to minimize the size or to practically completely get rid of such, for instance) between the at least one electrical element and the first material layer.

In various embodiments, the at least one electrical element, optionally solely or at least including said converter element, comprises at least one element selected from the group consisting of: signal filtering element, protection circuit element, such as a protection diode or a transient suppressor component, regulator, power supply, switched mode power supply (SMPS), power receiving coil, power transferring coil, coil, inductor, amplifier, attenuator, integrated circuit, processing unit, microcontroller, microprocessor, signal processor, logic array, logic chip, programmable logic, capacitor, and input capacitor.

In various embodiments, the first connection element comprises essentially an electro-mechanical connector, optionally a male or a female part of two mutually compatible electro-mechanical connectors. The connector may be one known in the art, to follow a selected interface standard, for example, or a proprietary one.

In various embodiments, the first connection element comprises a wireless connection element, such as a coil or a capacitive element.

In various embodiments, the first connection element may comprise a first part or portion, optionally an electro-mechanical connector (computer bus connector, vehicle harness connector, automation bus connector, etc.), which at least partially resides or extends outside the cavity in order to face and connect with a compatible connection member, such as an electro-mechanical connector, of the external system, and a second portion, such as a number of conductors, which are configured to at least functionally, preferably electrically or electromagnetically, establish the connection between the first portion and the converter element.

In various embodiments, the converter element and/or the first connection element, i.e. the two may function together, is adapted for providing wired connectivity based on at least one wired connecting or communication technique, technology or related standard selected from the group consisting of: CAN (Controller Area Network), LIN (Local Interconnect Network), USB 3.0 (Universal Serial Bus), USB 2.0, USB, HMI (Human-Machine Interface), SPI (Serial Peripheral Interface), UART (Universal Asynchronous Receiver Transmitter) or asynchronous serial communication, vehicle bus communication, bus communication, automation bus communication, computer bus communication, serial communication, parallel communication, I2C (InterIntegrated Circuit), LAN (Local Area Network), Ethernet, and PoE (Power over Ethernet). For example, the first connection element may be configured to adopt at least selected mechanical (e.g. connector specs) aspects of the target technology, defined e.g. by a selected standard, while the converter element may be configured to follow the signaling/signal aspects and subsequently take care of signal processing or specifically, adaptation aspects, between the external system and the host.

In various embodiments, the converter element and/or the first connection element may be adapted for providing wireless connectivity based on at least one wireless connecting technique, technology or related standard selected from the group consisting of: BlueTooth, WLAN/WiFi, and NB-IoT (NarrowBand IoT). The first connection element may include e.g. a transducer such as a coil controlled by the converter element, for instance.

In various embodiments, the first substrate film is a formed, such as thermoformed, substrate film or an injection molded substrate film defining the cavity. Initially, the film may have been e.g. essentially planar (2D), but through (3D-)forming and/or other suitable processing, at least the cavity may have been established therein. At least a portion of an element such as an electrical element of the at least one electrical element may have been provided to the film prior to or subsequent to forming.

In various embodiments, the interface arrangement may comprise at least one thermal management element, for cooling or heating, for instance, optionally including at least one element of the following: a heat sink, a thermal slug, and a thermal well. A thermal management element may be a substantially monolithic element, multi-part element (the parts may be removably or fixedly connected), and/or integral with some other element(s), such as a connector or electrical element.

In various embodiments, the thermal management element may be configured to at least thermally, if not e.g. physically, to connect or contact the interface arrangement, a feature such as an electrical element, fill, substrate, conductor, contact and/or connector thereof, other element outside it, and/or e.g. (electronic) component of a multilayer structure containing the interface, which multilayer structure is contemplated hereinafter in more detail. The associated thermal connection may be convection, conduction and/or radiation based, for instance.

In various embodiments, the thermal management element may be arranged within the cavity or at least partly outside the cavity, for example, on the first substrate film or extending outside the cavity from an essentially open side of the cavity. The thermal management element may, additionally or alternatively, be arranged through the first substrate film via a cut or a through-hole, for instance. Furthermore, the thermal management element may be arranged to extend through the second substrate, if any.

In some embodiments of e.g. the aforesaid multilayer structure, at least one thermal management element may be located essentially outside the interface, optionally integral or connected with an element such as an electronic component, considering e.g. high-power LEDs prone to (over)heating in certain conditions.

In various embodiments, the thermal management element may comprise a heat sink, which indeed may be arranged e.g. completely or at least partly inside the cavity.

In various embodiments, element(s) such as the first and/or the second connection elements, as a part of, connected or integral with the thermal management element, may comprise material having high thermal conductivity, such as of thick copper conductors.

In various embodiments, the thermal management element or elements, such as heat pipes, may be arranged in connection with a suitable element such as the first connection element for operating as a heat sink or to conduct heat into or out of the interface arrangement.

According to one aspect, a method for manufacturing an interface arrangement for providing a connection such as electric or electromagnetic connection between an external system and a host structure of the interface arrangement is provided, the method comprising:
  obtaining a first substrate film defining a cavity;
  arranging at least one electrical element at least partly into the cavity, wherein the at least one electrical element comprises at least a converter element configured for adapting signals to be transferred between said external system and electronics of the host structure;
  arranging a first connection element, optionally comprising a first electro-mechanical connector or wireless connection element, configured for connecting to the external system, preferably at least partly into the cavity, said first connection element being at least functionally connected to the converter element; and
  providing a first material layer by filling at least partly the cavity with a first material, and embedding or at least partly covering the at least one electrical element arranged into the cavity.

In various embodiments, there is provided a second connection element for connecting to the host structure into at least functional, preferably electrical, connection with the converter element.

In various embodiments, a multilayer structure for hosting e.g. electronics or electrical components, comprises a host substrate configured to host e.g. electronics, optionally a number of electric traces and/or electronic components further optionally at least some of which being implemented as preferably electrical node type components, and an interface arrangement, optionally an essentially electrical or specifically electronic component of preferably electrical node type, arranged to provide connection between an external system and the electronics of the multilayer structure, the interface arrangement comprising:

a first substrate film defining a cavity;

a first material layer arranged to at least partly fill the cavity, and to embed or at least partly cover at least one electrical element arranged into the cavity, wherein the at least one electrical element comprises at least a converter element configured for adapting signals to be transferred between said external system and the multilayer structure; and a first connection element preferably arranged at least partly into the cavity and configured for connecting to the external system, wherein the first connection element is at least functionally connected to the converter element; and wherein the multilayer structure further comprises:

a molded or cast material layer at least partly embedding or covering said first substrate film, and thus preferably the interface arrangement, arranged onto the host substrate.

In various embodiments, the multilayer structure comprises a second connection element attached to the host substrate for providing connection to the host substrate and at least functionally connected to the converter element.

In various embodiments, the electronics comprises at least one electrical or electronic component arranged on the host substrate, wherein the component is at least functionally, preferably electrically or electro-magnetically, connected to the converter element preferably via a second connection element of the interface arrangement and optionally a number of electrically conductive traces preferably printed, even more preferably through utilization of printed electronics technology, upon the host substrate.

In various embodiments, the converter element may comprise a number of first and second terminals or similar connection features for functionally connecting the converter element to the external system, preferably via the first and second connection elements.

In various embodiments, the multilayer structure may comprise at least one thermal management element as discussed hereinelsewhere.

Having regard to the utility of the present invention, the present invention provides, depending on the embodiment, various advantages over known solutions such that the interface arrangements utilizing electrical nodes reduces the complexity of integrating functionalities, for example, electrical circuits forming switch-mode power supplies and dense-pitch microcontrollers, into multilayer structures. In many cases the amount of wiring is also reduced. The number of functionalities that can be easily embedded in an electrical node according to the present invention greatly enhance value gained from implementing the structure and its functionalities with IMSE instead of using any of the available traditional technologies. The electrical node has a structure that can be optimized for efficiency, low electromagnetic interference (EMI) or other parameters, for instance. For example, a switch-mode circuitry can be tailored to meet emission limits with greatly reduced risk for failing results in electromagnetic compatibility (EMC) tests. From a software developing perspective, the effort required to implement IMSE structures can also be greatly reduced, as pre-selected and pre-manufactured electrical nodes will have known structure and known functionalities. Providing drivers with the possibility to auto-generate driver code based on pre-configurable functionality models can enable implementing the functionalities.

Additionally, the electrical node approach for producing interfaces or interface arrangements enables using a much greater proportion of currently available electrical components: most of the new components released to the market are packaged in very dense, tiny packages with potentially very high power density that are very challenging to directly integrate in IMSE structures due to physical limitations: print resolution, adhesive spreading and splatter, reliable filling and exclusion of air. For a designer not intimately familiar with the challenges in directly embedding complex circuitry and many components in plastic, the electrical node approach is significantly safer way to integrate the functionalities. As the degree of integration in IMSE parts is increased (more and more functionalities are integrated inside the plastic), fewer and fewer connections to the outside world are needed. The present invention provides some very potential interfaces that could greatly simplify system design through creation of assets that can be shared between an enormous variety of parts, simplifying supply chains and facilitating assembly and repair.

For example, different interface circuitry and e.g. protection circuitry required to implement power transfer and/or communication (control and/or other data) between an external system, such as a vehicle electronics system (offering e.g. CAN/LIN bus connection), automation system or other electronics system, and the host structure, such as IMSE structure, of the interface arrangement, can be cleverly adopted in the interface arrangement, which in turn may reduce even to a single component preferably of electrical node type, which can be prepared and verified (tested, for instance) upfront and then provided on a host substrate of the host structure upon need. The interface arrangement may be then manufactured and/or verified by one party (e.g. company) while the arrangement is provided in the host structure by another party, for instance.

Accordingly, outsourcing of electronics manufacturing and verification processes gets easier, component selection wider, customization easier, etc. Yet, while e.g. external system facing side including e.g. the first connection element and related aspects (processing, required hardware, etc.) of the converter element may be process-specific or case-specific, or platformized, the host structure facing side including e.g. the second connection element and related aspects of the converter element may remain the same through various applications and use cases, which will reduce production costs of (IMSE) host structures through simplifying and streamlining related design, manufacturing, and testing/verification processes.

By inclusion of thermal management elements in the interface or multilayer structure containing the interface as discussed herein many potential thermal management related issues such as overheating of electronic components may be reduced or avoided.

Various other advantages will become clear to a skilled person based on the following detailed description.

The expression "a number of" may herein refer to any positive integer starting from one (1).

The expression "a plurality of" may refer to any positive integer starting from two (2), respectively.

The terms "first", "second", and "third" are herein used to distinguish one element from other element(s), and not to specially prioritize or order them, if not otherwise explicitly stated.

The exemplary embodiments of the present invention presented herein are not to be interpreted to pose limitations to the applicability of the appended claims. The verb "to comprise" is used herein as an open limitation that does not exclude the existence of also un-recited features. The features recited in various embodiments and dependent claims are mutually freely combinable unless otherwise explicitly stated. Yet, various embodiments of the interface arrangement disclosed herein may be (mutatis mutandis) flexibly adopted in the desired embodiments of the multilayer structure or the method of manufacture, or vice versa, as being easily comprehended by a person skilled in the art.

The novel features which are considered as characteristic of the present invention are set forth in particular in the appended claims. The present invention itself, however, both as to its construction and its method of operation, together with additional objectives and advantages thereof, will be best understood from the following description of specific embodiments when read in connection with the accompanying drawings.

BRIEF DESCRIPTION OF FIGURES

Some embodiments of the invention are illustrated by way of example, and not by way of limitation, in the figures of the accompanying drawings.

DETAILED DESCRIPTION OF SOME EMBODIMENTS

Various examples or embodiments of electrical nodes discussed herein, to be optionally also flexibly and/or selectively combined by a person skilled in the art upon need, are suitable for use in various applications, such as forming e.g. at least part of interface arrangements between systems as contemplated hereinelsewhere, that is as an interface node or similar component. The interface node may advantageously be arranged on a host structure or multilayer structure in similar manner as an electronic component. The interface node thus may preferably provide in one, at least component-like, unit an interface for an external system and additionally may comprise other components at least part of which may be protected by the electrical node type structure as presented herein.

Figure 1:
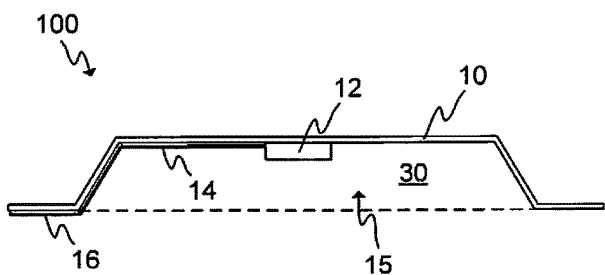
FIG. 1 illustrates schematically an electrical node according to an embodiment of the present invention.

FIG. 1 illustrates schematically an electrical node 100 according to an embodiment of the present invention. The electrical node 100 in FIG. 1 comprises a first substrate film 10, such as of polycarbonate (PC) or comprising PC, defining a cavity 15 (e.g. a recess or protrusion shape depending on the inspection angle) and a first material layer 30 or volume arranged to at least partly fill the cavity 15, and to embed or at least partly cover at least one electrical element 12 arranged into the cavity 15. In FIG. 1, the at least one electrical element 12, such as a capacitive sensing element or a conductor or a printed electronics component, such as a light emitting diode, has been printed, such as screen printed or inkjet printed, and/or otherwise provided on the first substrate film 10 and into the cavity 15. The element 12 may have been provided on the bottom of the cavity 15, for instance (e.g. substantially centered or provided closer to a side wall thereof). There may be only one element 12 or advantageously a plurality of electrical elements 12 forming e.g. an electrical circuit capable of providing at least one functionality, such as lighting. Furthermore, there may be at least one electrical contact element or generally connection element 16 arranged to the electrical node 100 and configured for providing typically e.g. electrical connection, such as galvanic, capacitive or inductive connection, into the node 100, typically particularly from outside the node 100, e.g. from element(s) residing on a common host surface, structure or generally substrate with the node 100 and/or from element(s) external thereto. The electrical contact element 16 may be electrically connected via an intermediate electrical connection element 14, such as an electrical conductor 14, such as printed conductor, with the at least one electrical element 12 or the electrical circuit thereof, if not being directly connected therewith for which purpose the element 12 may comprise a number of connecting features such as terminals or contacts.

According to various embodiments, the first material layer 30 may be or comprise polymer, plastic and/or silicone, for instance. According to various advantageous embodiments, the first material layer 30 may be elastic, thus providing e.g. mechanical protection for the electrical element or elements 12 embedded therein or at least partly covered by the first material layer 10.

In some embodiments, the first material layer 30 may be comprised of a plurality of materials or material layers.

Figure 2:
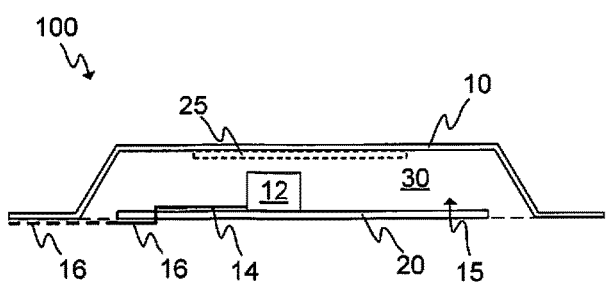
FIG. 2 illustrates schematically an electrical node according to an embodiment of the present invention.

FIG. 2 illustrates schematically an electrical node 100 according to an embodiment of the present invention. The electrical node 100 in FIG. 2 comprises a first substrate film 10 defining a cavity 15 and a first material layer 30 arranged to at least partly fill the cavity 15, and to embed or at least partly cover at least one electrical element 12 arranged into the cavity 15. In FIG. 2, the electrical node 100 further comprises a second substrate 20, such as a printed circuit board or a piece thereof, or a further film, comprising the at least one electrical element 12. Furthermore, the second substrate 20 is arranged so that the at least one electrical element 12 is positioned into the cavity 15 and embedded in or at least partly covered by the first material layer 30. There may be only one element 12 or advantageously a plurality of electrical elements 12 forming an electrical circuit capable of providing a functionality, such as lighting, on the second substrate 20. Furthermore, there may be an electrical contact element 16 arranged to the electrical node 100 and configured for providing electrical connection, such as galvanic, capacitive or inductive connection, into the node 100. As contemplated hereinbefore with respect to FIG. 1, the electrical contact element 16 may be electrically connected, optionally via an electrical connection element 14, with the at least one electrical element 12 or the electrical circuit thereof. There may be a number of features 25 such as electrical elements provided to the first film 10 as well, on any side of (depicted in the figure on the side facing the cavity 15).

Figure 3:
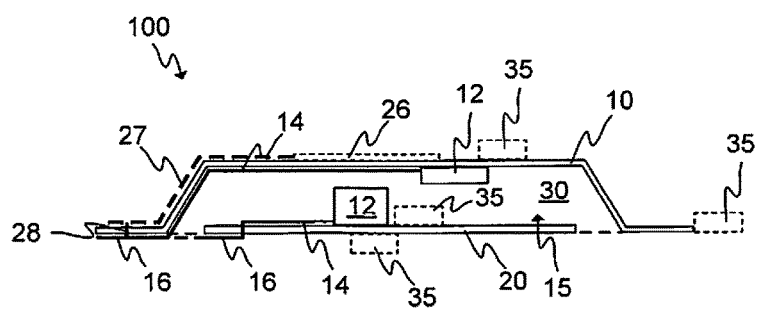
FIG. 3 illustrates schematically an electrical node according to an embodiment of the present invention.

FIG. 3 illustrates schematically an electrical node 100 according to an embodiment of the present invention. The electrical node 100 in FIG. 3 comprises a first substrate film 10 defining a cavity 15 and a first material layer 30 arranged to at least partly fill the cavity 15, and to embed or at least partly cover at least one electrical element 12 arranged into the cavity 15. However, in this case, there are at least two electrical elements 12 arranged into the cavity 15, at least one being arranged as in FIG. 1 and at least one other as in FIG. 2.

Furthermore, applicable also to FIGS. 1 and 2, there may be at least one second electrical element 26 arranged on the first substrate film 10 on the opposite side of the first substrate film 10 with respect to the cavity 15. In FIG. 3, the second electrical element 26, such as a capacitive sensing element 26, is arranged at a corresponding position with respect to the cavity 15, however, the second electrical element 26 could alternatively or in addition be arranged in other parts of the first substrate film 10 (see e.g. item 25 of FIG. 2). Still as a further option, the second electrical element 26 may be connected through a second electrical connection element 27 and/or via the feed-through 28 to a feature such as an electrical contact element 16, being the same or a different one with respect to the electrical contact element 16 in connection with the electrical element 12.

According to various embodiments, such as any of ones shown in FIGS. 1-3, the node 100 may comprise a number of thermal management features or elements 35 such as a heat sink for cooling the node, particularly the electrical element 12 or elements 12, thereof. The heat sink and/or other thermal management feature(s) may be embedded e.g. into the first material layer 30 and/or provided at least partly outside of the node 100 (utilizing e.g. a via/hole provided in the exterior part such as film 10 optionally prior to or subsequent to e.g. provision of cover plastics thereon using e.g. molding) in order to provide cooling, for instance. Still further, the heat sink or similar functionality may be arranged in connection with a heat exchanging element of an external device, or, for example, of a circuit board (consider e.g. metal core or thermal PCB). Generally, a thermal management element or feature may have a high thermal conductivity and e.g. heat dissipation properties, provided by the included material(s), dimensions, shape and/or (surface) area thereof. The material(s) may include many metals (e.g. copper, silver, aluminium) and their alloys in addition to or instead of e.g. thermally conductive polymers, pastes, molded material(s), for instance. In some embodiments, a thermal management element that is essentially a thermal insulator, may be utilized in addition to or instead of thermal conductors.

Thermal management element 35 may advantageously be configured to distribute, convey or spread thermal energy/heat within and/or outside the node 100 or the interface arrangement. Thermal energy or heat may be conveyed to a selected or whole area of the node 100 or the arrangement, and then outside the node 100 or the arrangement, for example, through a second substrate 20, if any, or a host substrate 60, therefore, yielding e.g. more efficient cooling of the node 100 or the arrangement with respect to providing cooling at a single point. This may be particularly beneficial if the node 100 or the arrangement comprises compact high-power components, such as high-power LEDs or LED drivers, in order to avoid hotspots.

In various embodiments, the thermal conductivity of such thermal management element 35 to conduct heat, or at least a part of it, may preferably be at least 2 W/mK, or preferably at least 10 W/mK, or more preferably at least 50 W/mK, or most preferably at least 100 W/mK. As being appreciated by a person skilled in the art, various materials having a lower thermal conductivity may be considered as thermal insulators whereas materials associated with a higher thermal conductivity may be generally more effectively utilized as thermal conductors e.g. for cooling/heat transfer purposes. The desired thermal conductivity may be obtained by suitable material selection of the thermal management element 35, for instance. In some embodiments, plastic material having thermal conductivity at least 10 W/mK may be utilized. In various embodiments, metal material, such as copper, aluminium, zinc, or tin-silver-copper (SnAgCu) composition, such as Sn—Ag3.5-Cu9.0, may be utilized in the thermal management element 35 or at least in part thereof. Thermal conductivities of various such metals are of the order of at least about 60 W/mK. Thus, quite many metals offer a better thermal conductivity than typical plastic materials, which may be exploited in various embodiments of the present invention for thermal management In various embodiments, the thermal management element 35, such as a thermal well, a thermal slug or a thermal pad, may be implemented at least partly by e.g. a lead frame, such as comprising of copper or copper alloy, of an electrical or electronics component. Furthermore, e.g. a thermal well may be implemented by a matrix of inlets through a substrate, such as a PCB. Thermal wells may particularly advantageously be utilized in multilayer substrates. Examples of thermal slugs or pads may comprise thermally conductive material arranged on a thin-shrink small-outline package (TSSOP) or on a quad-flat no-lead (QFN) package.

According to various embodiments, the electrical node 100 may indeed comprise a circuit board, such as the second substrate 20, or an electrical element 12 having a metal core or based on multilayer ceramics technology, such as high temperature co-fired ceramics (HTCC) or low temperature co-fired ceramics (LTCC), which may further provide cooling and/or heating through thermal conduction.

According to an embodiment, the thermal management element(s) 35 may, in addition to or instead of comprising dedicated element(s), be integrated with a number of elements and/or components of the electrical node 100, or of the interface arrangement preferably comprising an embodiment of the node 100. For example, this may entail utilizing electrical conductors designed with such properties, such as dimensions, that they function as a thermal management element 35 or at least a portion thereof, such as a heat sink or thermally conductive element.

In various embodiments, the electrical node 100 or the interface arrangement (described in more detail hereinafter) may comprise a thermal management element 35, such as at least one of the following: a heat sink, a thermal slug, a thermal well. The thermal management element 35 may be arranged within the cavity 15 or at least partly outside the cavity 15, for example, on the first substrate film 10 or extending outside the cavity from an open side of the cavity 15. The thermal management element 35 may, additionally or alternatively, be arranged through the first substrate film 10 via a cut or a through-hole, for instance. Furthermore, the thermal management element 35 may be arranged the extend through the second substrate 20, if any. Additionally or alternatively, the thermal management element 35 may comprise a heat sink arranged completely or at least partly inside the cavity 15. In some embodiments, the first 45 (shown e.g. in FIGS. 13-16) and/or the second 16 connection elements, as a part of the thermal management element 35, may consist of or comprise material having high thermal conductivity, such as of thick copper conductors. The thermal management element 35 or elements 35, such as heat pipes, may alternatively or additionally be arranged in connection with the first connection element 45 for operating as a heat sink or to conduct heat into or out of the electrical node 100 or the interface arrangement.

In various embodiments, the electrical node 100 or the interface arrangement may comprise, such as being provided into the cavity 15, thermally conductive first material layer 30 to operate in addition to e.g. protective layer, for instance, as thermal management element 35. Still further, the first material layer 30 may be provided only partly, such as at corresponding positions with heat generating components, such as processing units or resistors, by utilizing thermally conductive material while the rest of the first material layer 30 may be of other material.

According to various embodiments in which the electrical node 100 or the interface arrangement has been arranged on a host substrate 60 or structure, the thermal management element(s) 35 may be in thermal connection with thermal management element(s) 35 of the host substrate 60. For example, there may be graphite or copper, such as pieces of graphite or copper tape, arranged on the host substrate 60 with corresponding positions with the electrical node 100 or the cavity 15 of the arrangement. Still further, these thermally conductive elements may extend along the host substrate 60 to conduct heat away, for example, from the node 100 or the arrangement.

In various embodiments comprising the electrical node 100 or the interface arrangement arranged on a host substrate 60 or structure, and comprising a molded or cast material layer 90 on the node 100 or the arrangement, at least part of the molded or cast material layer 90 may be of thermally conductive material, if not completely, such as the part at least partly covering or embedding the first substrate film 10.

FIGS. 4A-4D illustrate schematically an electrical node 100 according to an embodiment of the present invention. FIGS. 4A-4D illustrate the electrical node 100 as a cross-sectional side view, from above, from below, and from a perspective view, respectively. The electrical element 12, such as a printed or mounted component, is arranged preferably therewithin, e.g. on the bottom of the cavity 15, and, optionally, conductors 14 connecting the electrical element 12 to the electrical contact element 16 are arranged at the peripheral part of the first substrate film 10.

Figure 4A:
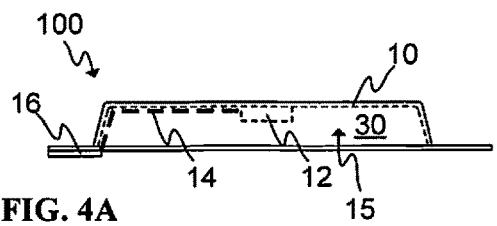
FIGS. 4A-4D illustrate schematically an electrical node according to an embodiment of the present invention.
Figure 4B:
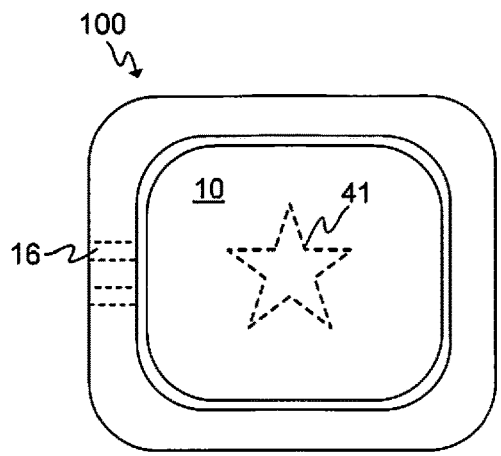
Figure 4C:
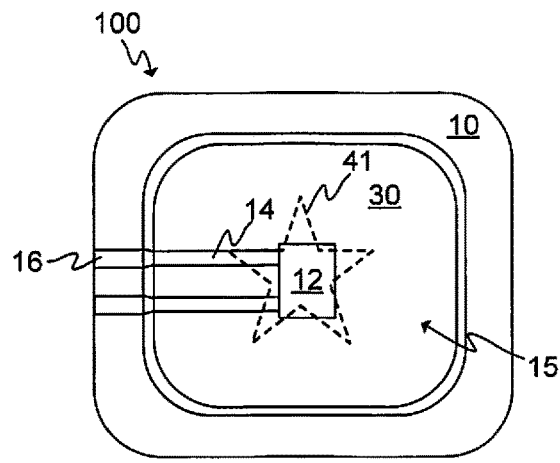
Figure 4D:
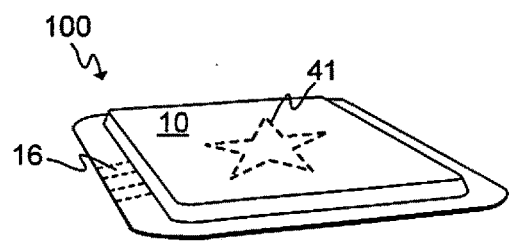

FIGS. 4B-4D further illustrate a functional and/or decorative element 41 being arranged on the first substrate film 10. The functional element 41 in FIGS. 4B-4D is or comprises, for example, a window of transparent material passing through light emitted by a light source arranged in the cavity 15, such as by a light-emitting diode (LED) type element 12. It may be utilized as a visual or optical indicator, and/or for lighting purposes, for example.

Figure 5A:
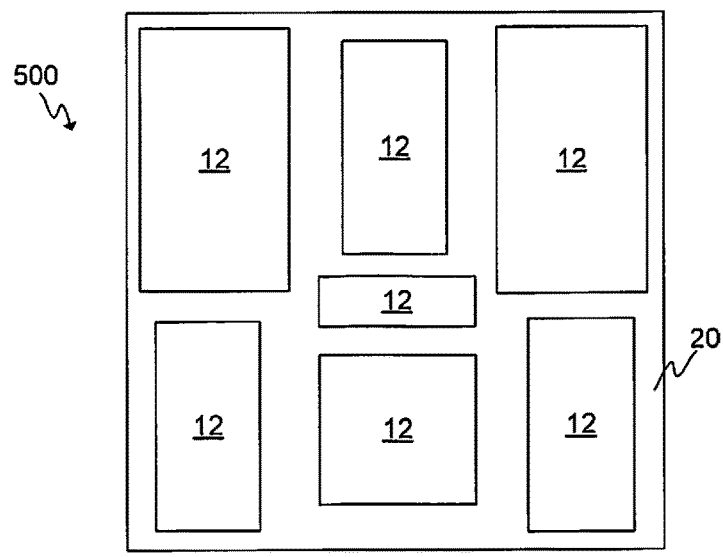
FIGS. 5A and 5B illustrate schematically a subassembly utilizable in an electrical node according to an embodiment of the present invention.
Figure 5B:
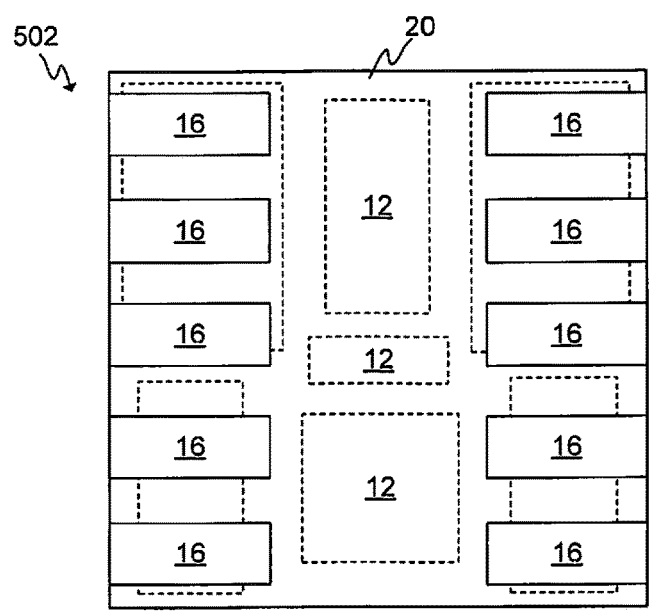

FIGS. 5A and 5B illustrate, at 500 and 502, schematically a subassembly utilizable in an electrical node 100 according to an embodiment of the present invention. The subassembly may comprise a plurality of electrical elements 12, preferably interconnected elements 12, forming an electrical circuit of the subassembly. The electrical circuit of this example case comprises elements of a two-channel LED driver can be as one subassembly on a substrate 20, such as a PCB. The subassembly may comprise, for example at the peripheral part thereof, inputs and/or outputs, in form of electrical contact elements 16, such as for electrical power, ground, two PWM (pulse-width modulation) inputs, two LED string anodes and two LED string cathodes on large, easy to mount contact pads instead of the complex jumble of circuitry between supply capacitors, inductors, timing resistors, sense resistors and tiny, power-dense driver IC. The subassembly may then be arranged into the cavity 15 and at least partly embedded or at least partly covered by the first material layer 30 according to an embodiment of the present invention. However, it could also be produced directly on the first substrate film 10 and into the cavity 15, or a region later establishing the cavity 15, and then arranged at least partly embedded or at least partly covered by the first material layer 30. It should further be noted, however, that various different kinds of subassemblies or electrical circuits having and/or configured to perform one or several functionalities may be arranged into an electrical node 100 according to an embodiment of the present invention, and not limited to the electrical circuit described hereinabove.

Figure 6A:
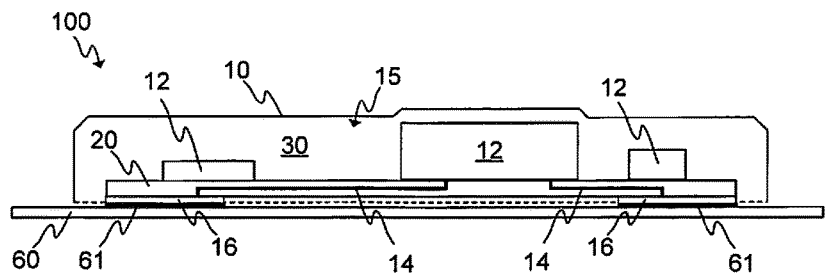
FIGS. 6A-6C illustrate schematically electrical nodes according to some embodiments of the present invention.
Figure 6B:
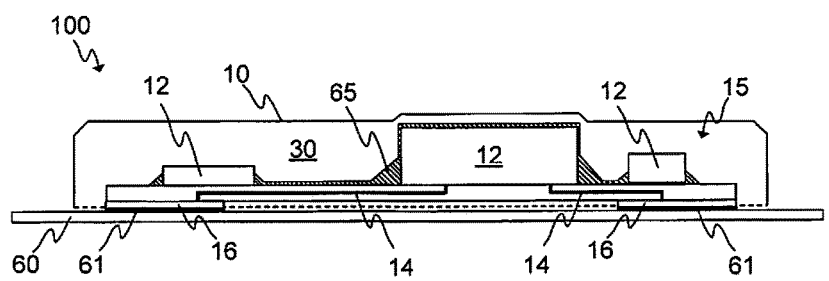
Figure 6C:
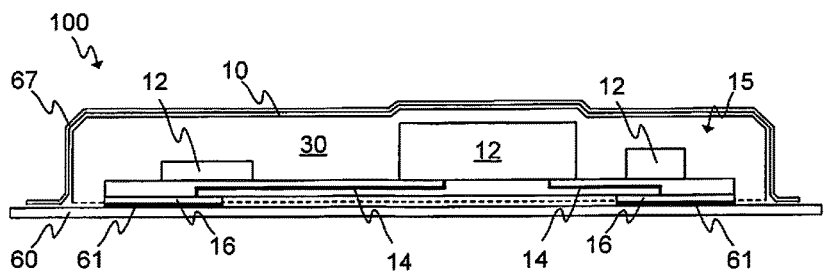

FIGS. 6A-6C illustrate schematically electrical nodes 100 according to some embodiments of the present invention. The electrical node 100 in FIG. 6A comprises a first substrate film 10 defining a cavity 15 and a first material layer 30 arranged to at least partly fill the cavity 15, and to embed or at least partly cover at least one electrical element 12 arranged into the cavity 15. In FIG. 2, the electrical node 100 comprises a second substrate 20, such as a printed circuit board or a piece thereof, comprising the at least one electrical element 12. Furthermore, the second substrate 20 is arranged so that the at least one electrical element 12 is positioned into the cavity 15 and embedded in or at least partly covered by the first material layer 30. There may be only one element 12 or advantageously a plurality of electrical elements 12 forming an electrical circuit capable of providing a functionality, such as lighting, on the second substrate 20. Furthermore, there may be an electrical contact element 16 arranged on the opposite side of the second substrate 20 with respect to the at least one electrical element 12 for providing electrical connection into the node 100.

FIG. 6A further illustrates a host substrate 60, such as a PCB or a film type substrate of e.g. plastic and/or organic material, onto which the electrical node 100 has been arranged on. The host substrate 60 preferably comprises electrical contact areas 61 to which the electrical node 100 may be, for example, attached by using conductive adhesive. The electrical node 100 is thus a component-like entity configured to perform one or several functionalities. The electrical connection between the node 100 and the host substrate 60, although shown as galvanic connection, may as well be arranged as capacitive or inductive connection. Furthermore, the first substrate film 10 of the electrical node 100 advantageously protects the components of in the cavity 15 when being overmolded by plastic and/or generally covered by further material, for instance.

The electrical node 100 in FIG. 6B is similar to one shown in FIG. 6A except that a second material layer 65 has been provided therewithin e.g. on the at least one electrical element 12 for reducing e.g. air pockets forming between the at least one electrical element 12 and the first material layer 30. The material(s) of the second layer 65 may differ from the one(s) of the primary fill (first layer) 30. The second material layer 65 may be covering the at least one electrical element 12, or at least some of them, if many, and, optionally, also at least part of the second substrate 20. The second material layer 65 may comprise or be, for example, of very easy-flowing and thoroughly wetting material, such as of liquid resin. The second material layer 65 may advantageously be used as a pre-filling material which flows into small gaps between electrical elements 12, such as electronic components, and/or parts of the structure and, thus, simplifies the geometry and/or "smooths" the surface(s) for facilitating the application of the first material layer 30.

The second material layer 65 may be of or comprise material, or a similar material, that is typically used in capillary underfill of IC components. The material layer 65 may, thus, be of a mixture of liquid organic resin binder and inorganic fillers. The organic binder may comprise, for example, epoxy resin mix or cyanate ester. Inorganic filler may include, for example, silica.

Alternatively or in addition, the second material layer 65 may be utilized in embodiments in which at least one electrical element 12 is arranged on the first substrate film 10 and into the cavity 15 for reducing air pockets.

The electrical node 100 in FIG. 6C is similar to one shown in FIG. 6A except that a layer such as a protective layer 67 has been arranged on the first substrate film 10. The protective layer 67 may also comprise on one or either one of its surfaces functional elements such as capacitive sensing elements or lighting devices or optical elements. The protective layer 67 may comprise e.g. a protective film, coating, shell structure and/or molded (plastic) layer as described in more detail with reference to FIG. 10, for instance. The protective layer 67 may cover one or a plurality of entities such as nodes 100 and/or other features such as electronic components provided on the host substrate 60.

Figure 7:
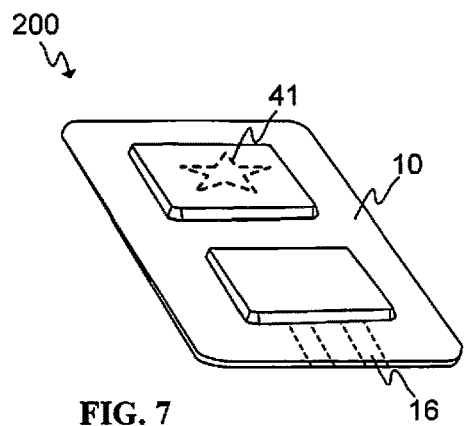
FIG. 7 illustrates schematically an electrical node strip according to an embodiment of the present invention.

FIG. 7 illustrates schematically an electrical node strip type embodiment of an assembly 200 according to the present invention. The strip 200 comprises e.g. elongated first substrate film 10 defining a plurality of cavities 15, in this case two, and at least a corresponding number of first material layers 30 with respect to a number of the plurality of cavities 15. Each of said first material layers 30 at least partly fills a respective one of the cavities 15 and embeds the at least one electronic component 12 therein. There may be electrical contact elements 16 arranged on the first substrate film 10 which may further be connected to the electrical elements 12 in one or both of the cavities 15.

Furthermore, at least two of the corresponding number of first material layers 30 may form common first material layer 30. This may entail that the first material layer 30 essentially extends between two cavities 15 thus forming continuous material layer.

Figure 8A:
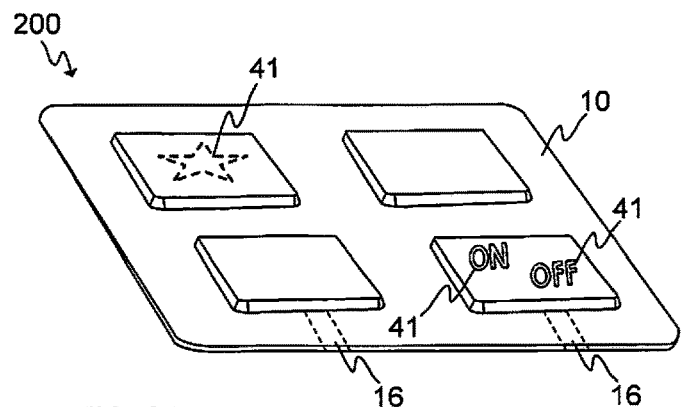
FIGS. 8A and 8B illustrate schematically an electrical node sheet according to an embodiment of the present invention.
Figure 8B:
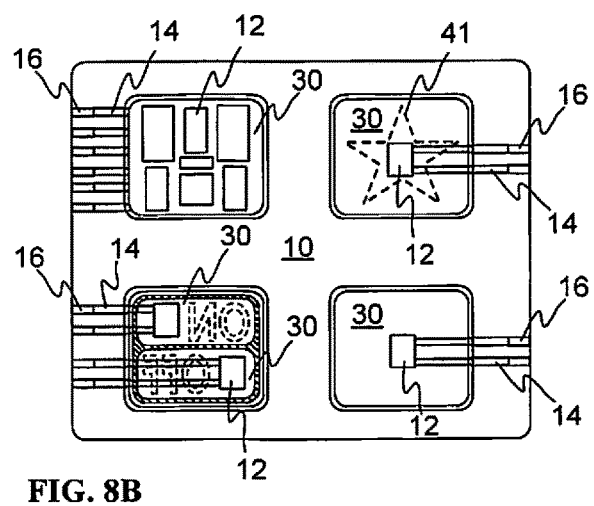

FIGS. 8A and 8B in turn illustrate schematically an electrical node sheet 200 according to an embodiment of the present invention. In FIG. 8A, the sheet 200 is shown as a perspective view from above the sheet 200. In FIG. 8B, the sheet 200 is shown as a perspective view from below the sheet 200. The sheet 200 comprises a first substrate film 10 defining a plurality of cavities 15, in this case four, and at least a corresponding number of first material layers 30 with respect to a number of the plurality of cavities 15. Each of said first material layers 30 at least partly fills a respective one of the cavities 15 and embeds the at least one electronic component 12 therein. There may be electrical contact elements 16 arranged on the first substrate film 10 which may further be connected to the electrical elements 12 in one, some or each of the cavities 15. Furthermore, at least two of the corresponding number of first material layers 30 may form common first material layer 30. This may entail that the first material layer 30 essentially extends between two cavities 15 thus forming continuous material layer.

FIGS. 7, 8A and 8B further illustrate a functional element 41 being arranged on the first substrate film 10. The functional element 41 may comprise, as discussed hereinearlier, for example, a window of transparent material passing through light emitted by a light source arranged in the cavity 15, such as by a LED.

In FIG. 8B, it is further illustrated that there may be more than one electrical element 12 arranged into one cavity 15. In this case, the lower left cavity 15, depicting "ON" and "OFF", may comprise e.g. two LEDs which are configured to illuminate one functional element 41, respectively, that is "ON" and "OFF". There may further be structures blocking the light of one LED from penetrating into the section of the other LED.

Figure 9:
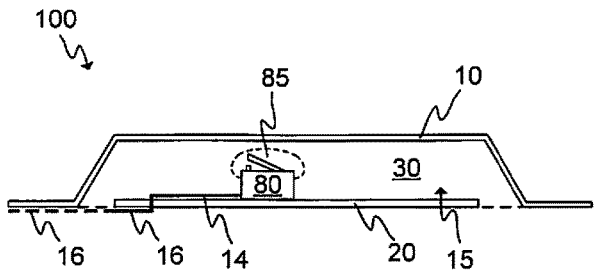
FIG. 9 illustrates schematically an electrical node according to an embodiment of the present invention.

FIG. 9 illustrates schematically an electrical node 100 according to an embodiment of the present invention. The electrical node 100 in FIG. 9 comprises a pocket such as air pocket 85 within the first material layer 30. The pocket 85 may contain any selected gas, such as air and/or one or several inert gases, or basically any type of gas or a combination thereof.

According to an embodiment, the pocket 85 may be utilized to enable the operation of e.g. a microelectromechanical system (MEMS) component 80, such as a switch, which requires that there is some free space or volume for a part of the component 80 to sufficiently move, for instance, to operate duly. The component 80 is a herein one type of an electrical element 12.

Figure 10:
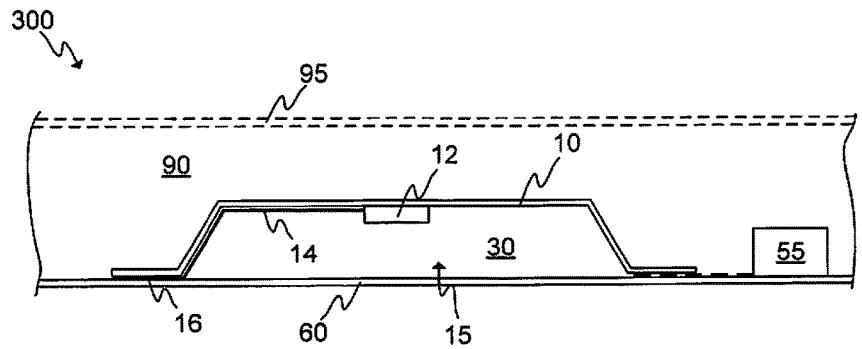
FIG. 10 illustrates schematically a multilayer structure according to an embodiment of the present invention.

FIG. 10 illustrates schematically a multilayer structure 300 according to an embodiment of the present invention. The multilayer structure 300 may comprise at least one electrical node 100 comprising: a first substrate film 10 defining a cavity 15, and a first material layer 30 arranged to at least partly fill the cavity 15, and to embed or at least partly cover at least one electrical element 12 arranged into the cavity 15; or at least one electrical node strip or sheet 200 comprising: a first substrate film 10 defining a plurality of cavities 15, and at least a corresponding number of first material layers 30 with respect to a number of the plurality of cavities 15, wherein each of said first material layers 30 at least partly fills a respective one of the cavities 15 and embeds the at least one electronic component 12 therein.

The multilayer structure 300 may further comprise a host substrate 60, wherein said at least one electrical node 100 or said at least one electrical node strip or sheet 200 is arranged on the host substrate 60.

Furthermore, the structure 300 may comprise e.g. a molded or cast material layer 90 covering said at least one electrical node 100 or e.g. said at least one electrical node strip or sheet 200 on the host substrate 60.

In some embodiments, there may be at least one further element such as a second substrate film 95 arranged on the opposite side of the molded or cast material layer 90. The molded or cast material layer 90 may be at least partly transparent and thus light can travel through the layer 90.

Furthermore, the second substrate film 95, if any, may also include a number of decorative and/or functional elements 41, such as windows for passing through light emitted by a LED in the cavity 15, for instance.

Yet, the structure 300 may host a number of elements such as electric or specifically electronic components 55 provided (mounted, printed, etc.) on the host substrate 60 and/or at least partially embedded in the layer 90, for instance. At least some of such elements 55 may be functionally such as electrically coupled to the node 100, and e.g. element 12 therein, via applicable connection elements such as contacts and/or conductor traces, optionally defining at least a portion of a greater circuit design upon the host substrate 60, for example.

According to an embodiment, the at least one electrical node 100 or the at least one electrical node strip or sheet type assembly 200 may be arranged on the host substrate 60 such that the at least one electrical element 12 is or elements 12 are between the first substrate film 10 and the host substrate 60.

According to an embodiment, the multilayer structure 300 may comprise at least one second electrical element arranged at on the first substrate film 10 on the opposite side of the first substrate film 10 with respect to the cavity 15.

Figure 11:
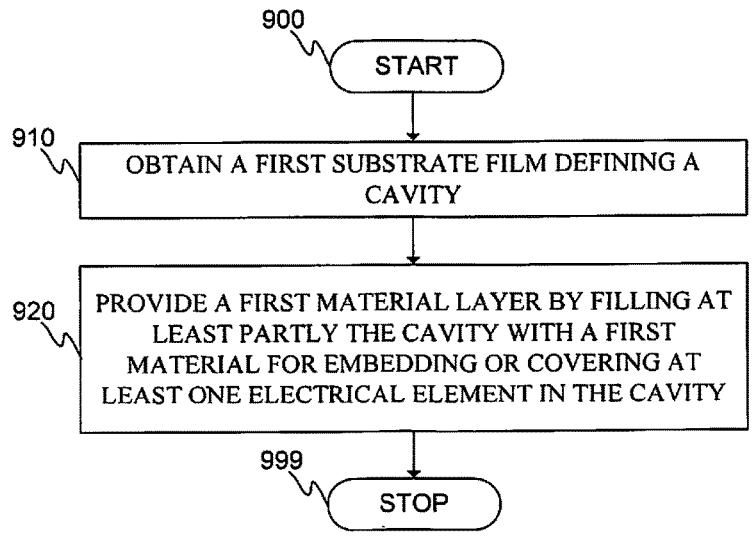
FIG. 11 illustrates a flow diagram of a method according to an embodiment of the present invention.

FIG. 11 illustrates a flow diagram of a method according to an embodiment of the present invention. At the beginning of the method for manufacturing an electrical node 100 e.g. for interface purposes, a start-up phase 900 may be executed. During start-up, the necessary tasks such as material, for example substrates, component and tools selection, acquisition, calibration and other configuration tasks may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding/IMD (in-mold decoration), lamination, bonding, (thermo) forming, electronics assembly, cut-ting, drilling and/or printing equipment, among others, may be thus ramped up to operational status at this stage.

At 910, a first substrate film 10 defining a cavity 15 may be obtained. According to an embodiment, the first substrate film 10 may be obtained by forming, such as thermoforming, cold-forming or utilizing vacuum or high pressure, an initial substrate film to define the cavity 15. According to another alternative or additional embodiment, the first substrate film 10 may be obtained by molding, such as injection molding, optionally directly in its target three-dimensional shape containing the cavity 15.

At 920, at least a first material layer may be provided by filling (e.g. by pouring, dispensing and/or (low-pressure) molding) at least partly the cavity with a first material. At least one electrical element 12 arranged into the cavity may at this step be embedded in or at least partly covered by the first material layer. At least one element of the electrical element 12 may be arranged to a target surface or material, e.g. on film 10, by mounting and/or printing, for example, optionally prior to or after said forming.

In some embodiments, the method may comprise providing at least one electrical contact or connection element 16 to the electrical node 100. The at least one electrical contact element 16 may be electrically connected to the at least one electrical element 12. The at least one electrical contact element 16 may be configured for providing electrical connection, such as galvanic, capacitive or inductive connection, into the node 100, especially from outside the node 100. This may entail, for example, having electrical contact pads 16 which may be optionally attached, such as soldered or by using conductive adhesive, to electrical contact elements of a host substrate 60, such as a PCB, for instance. According to various embodiments, the at least one electrical contact element 16, one or several, may be arranged at a peripheral portion of the first substrate film 10 for providing electrical connection into the node 100.

In some embodiments, as alluded to above, the method may comprise printing, such as screen printing or inkjet printing, or other forms of printed electronics technology, the at least one electrical element 12 on the first substrate film 10 and into the cavity 15, that is, on a portion of the first substrate film 10 forming the inner surface of the cavity 15. Alternatively or additionally, a number of further features such as contact elements 16 may be obtained by printed electronics technology.

In some embodiments, the method may comprise obtaining a second substrate 20, such as a printed circuit board, comprising the at least one electrical element 12, and arranging the second substrate 20 so that the at least one electrical element 12 is positioned into the cavity 15 so that the at least one electrical element 12 is embedded or at least partly covered by the first material layer 30.

In various embodiments, a number of conductive areas defining e.g. conductor lines (traces) and/or contact pads and/or electrodes to construct a circuit design are provided on the film(s), either or both sides thereof, preferably by one or more additive techniques of printed electronics technology. For example, screen, inkjet, flexographic, gravure or offset lithographic printing may be utilized. Also further actions cultivating the film(s) involving e.g. printing or generally provision of graphics, visual indicators, optical elements, etc. thereon may take place here. Accordingly, also a number of electrically non-conductive or insulating features may be provided preferably by printed electronics technology in the concerned structure.

In various embodiments, a number of thermal management elements may be provided (mounted, printed, preferably utilizing printed electronics technology, etc.), e.g. in connection with other elements such as element 12 (optionally integral therewith) as discussed hereinelsewhere. In some embodiments, one or more thermal management elements, or parts thereof, may provided e.g. on a host substrate 60 of a multilayer structure, outside an electrical node. A feature such as a connector or conductor may in some embodiments, besides its other or potential "primary" function, have also a thermal management function, which may be taken into account in the design of the feature having regard to e.g. material selection (e.g. both electrically and thermally conductive material such as a suitable metal may be used) and shape/dimensions.

In various embodiments, one or more nodes may be then provided in or utilized to establish a system or specifically, integral multilayer structure as described hereinelsewhere, for instance, the system or particularly, the multilayer structure comprising a number of further features, optionally further device(s), in addition to the nodes.

At 999, method execution is ended.

Figure 12A:
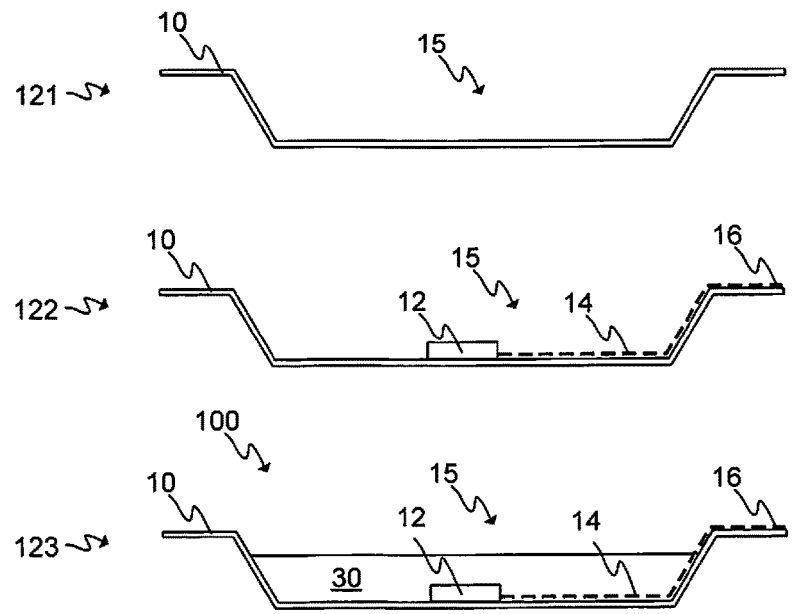
FIGS. 12A and 12B illustrate various stages of manufacturing an electrical node according to an embodiment of the present invention.
Figure 12B:
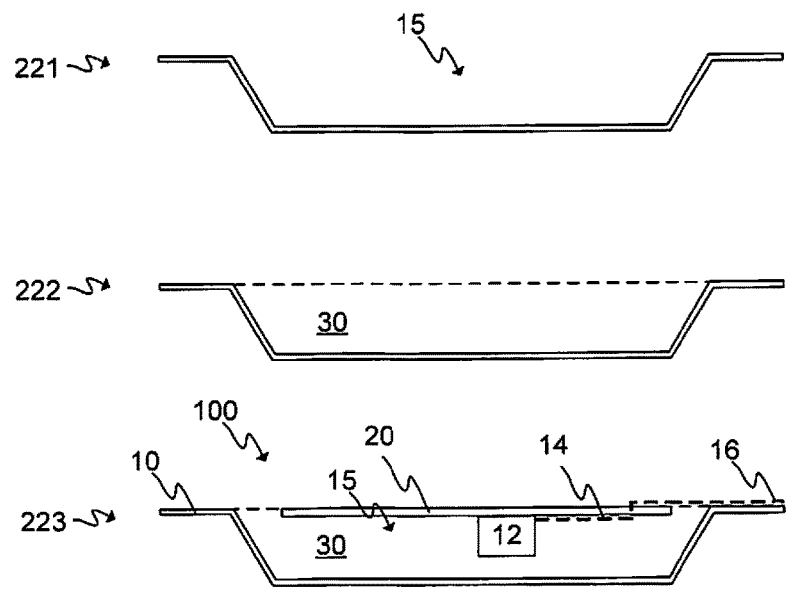

FIGS. 12A and 12B illustrate various potential stages of manufacturing an electrical node according to an embodiment of the present invention. Generally, various aspects described e.g. having regard to FIG. 11 are also applicable here.

In FIG. 12A, at 121, a first substrate film 10 defining a cavity 15 may be obtained. According to an embodiment, the first substrate film 10 may be obtained by forming, such as thermoforming, cold-forming or utilizing vacuum or high pressure, a substrate film (optionally initially planar) to define the cavity 15. According to another alternative or additional embodiment, the first substrate film 10 may be obtained by molding, such as injection molding. At 122, at least one electrical element 12 may be provided on the first substrate film 12 and into the cavity 15. Optionally, an electrical connection element 14 and electrical contact element 16 may also be provided on the first substrate film 10. At 123, a first material layer 30 may be provided to at least partly fill the cavity 15, and to embed or at least partly cover the at least one electrical element 12. In various embodiments, the first 30 and potential further material layers may optionally at least partially solidify, or be solidified, and/or otherwise change in terms of properties such as softness or elasticity, using a selected treatment, which may incorporate subjecting to heat, cold, temperature, and/or pressure, for example, and/or responsive to passage of time e.g. in suitable environment as to the above and/or other parameters.

In FIG. 12B, at 221, a first substrate film 10 defining a cavity 15 may be obtained. According to an embodiment, the first substrate film 10 may be obtained by forming, such as thermoforming, cold-forming or utilizing vacuum or high pressure, a substrate film to define the cavity 15. According to another alternative or additional embodiment, the first substrate film 10 may be obtained by molding, such as injection molding. At 122, a first material layer 30 may be provided to at least partly fill the cavity 15. At 123, at least one electrical element 12 may be provided, preferably on a second substrate 20, into the cavity 15 for embedding or at least partly covering the at least one electrical element 12. Optionally, an electrical connection element 14 and electrical contact element 16 may also be provided on the second substrate 20, or on the first substrate film 10, or e.g. after solidification of the first material layer 30, on the first material layer 30, or on two or more of said elements. According to another embodiment, the second substrate 20 comprising the electrical element 12 may first be arranged so that the electrical element 12 is in the cavity, or preferably at least part of the substrate 20 also, and only after that the first material layer 30 is being provided into the cavity 15 to embed or at least partly cover the electrical element 12.

A system comprising at least one electrical node as described herein (the included nodes may be mutually similar or different in terms of construction, materials, included elements and/or related functionalities) may be provided. In the system, the at least one node may be, optionally removably, attached e.g to a host device, material and/or structure, e.g. to a selected target or host surface, or substrate, thereof, which may be provided with connecting feature(s) such as mechanical and/or electrical connection elements for the node.

For the host device or structure (e.g. IMSE structure, part or device), and/or other device or structure of the system, the at least one node may provide a desired functionality such as a sensing function, processing function, power transfer function, data storage function, indication, communication and/or user interface (UI) function. The at least one node and e.g. at least one electrical element such as electronic component therein may be functionally such as electrically, electromagnetically, thermally or optically connected to an element such as an electronic component of the host and/or some external device or structure e.g. via one or more connection elements including e.g. a number of conductive traces, pins, connectors, wiring and/or cabling. Additional or alternative wireless (e.g. radio frequency) coupling is possible as well through implementing a selected wireless transfer technology and related elements (transmitter, receiver, transceiver). The at least one node and the element of the host/external device or structure may be configured to function cooperatively and thus establish a desired joint entity.

In some embodiments the system may be realized as a preferably integral multilayer structure, few feasible embodiments of which being deliberated already hereinbefore. The structure may contain one or more electrical nodes, optionally being functionally such as electrically connected together. Yet the structure may comprise a host substrate, optionally comprising formable such as thermoformable material that may be utilized or have been utilized to establish a desired three-dimensional shape through forming. The host substrate may be configured to accommodate the electrical nodes. Forming of the host substrate into a desired 3D-shape may take place prior to and/or subsequent to provision of features such as electrical nodes and/or other features thereon.

In various embodiments of the system or a multilayer structure as its one realization, e.g. molded or cast material layer comprising e.g. thermoplastic material may be provided on the host substrate, thus embedding at least portion of at least one of said one or more electrical nodes and/or other features such as further electrical elements (e.g. electronics including electronic component(s), for instance) provided thereon. The multilayer structure may indeed comprise a number of additional features such as electrical elements and/or thermal management elements provided to the host substrate and/or other layer of the structure and further optionally functionally, such as electrically and/or thermally, connected with at least one of said one or more electrical nodes to establish a desired connection for e.g. control, power, heat or data transfer purposes therebetween.

According to an embodiment, the electrical element 12 may comprise a processing unit, such as a microcontroller, signal processor or a processor. By arranging the processing unit into the node 100, access to the processing unit at least directly via its pins can be prevented. There can be arranged further components into the node 100 through which the access is possible and which may include proprietary software and selected protocols for controlled access.

According to one embodiment, the electrical node 100 or a related system/multilayer structure 300 may be used in a security tag for clothing. Yet it may easily find use e.g. in connection with vehicles (e.g. in-vehicle electronics), lighting devices, wearable electronics, computing or communication devices, consumer electronics, measurement devices, and various other products.

In various embodiments, one or more, typically ready-made, components or elements including electrical elements such as electronic components, e.g. various SMDs, may be attached or provided on the film(s) or (other) substrate(s) e.g. by solder and/or adhesives. Alternatively or additionally, printed electronics technology may be applied to actually manufacture at least part of the components, such as OLEDs, directly onto the film(s) or substrate(s).

As also discussed hereinelsewhere, the electrical element 12 may be provided on the film 10 utilizing any feasible positioning or installation technique such as standard pick and place method/equipment (when applicable). Applicable bonding (using e.g. adhesive or other bonding substance), gluing, and/or further securing techniques may be additionally utilized. Furthermore, the electrical element 12 may be printed, injection molded or dip molded.

In various embodiments, the electrical element 12 and/or other features of the node 100, multilayer structure 300 or aforementioned system may comprise at least one element selected from the group consisting of: electronic component, electromechanical component, electro-optical component, radiation-emitting component, light-emitting component, LED (light-emitting diode), OLED (organic LED), side-shooting LED or other light source, top-shooting LED or other light source, bottom-shooting LED or other light source, radiation detecting component, light-detecting or light-sensitive component, photodiode, phototransistor, photovoltaic device, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single-electrode capacitive switch or sensor, capacitive button, multi-electrode capacitive switch or sensor, self-capacitance sensor, mutual capacitive sensor, inductive sensor, sensor electrode, micromechanical (MEMS) component, UI element, user input element, vibration element, sound producing element, communication element, transmitter, receiver, transceiver, antenna, resonator, infrared (IR) receiver or transmitter, wireless communication element, wireless tag, radio tag, tag reader, data processing element, data storage or memory element, electronic sub-assembly, light directing element, lightguide, lens and reflector. In case a sensor requiring functional connection with the environment is arranged e.g. within the node 100, the connection may be further provided thereto (e.g. fluidic, optical and/or electrical connection as also contemplated hereinbefore).

The node 100, or the multilayer structure 300, may thus incorporate electronics such as IC(s) and/or various components. At least part of the electronics of the multilayer structure 300 may be provided via an electrical node 100. Optionally, the node and/or one or more other elements such as electronic components or thermal management elements of the structure 300 may be at least partially overmolded by a protective plastic layer as discussed hereinbefore. For example, adhesive, pressure, mechanical fixing features, and/or heat may be used for mechanical bonding of the node 100 with the film 10 or substrate 20, for instance. Solder, wiring and conductive ink are examples of applicable options for providing electrical connections between the elements of the node 100 and/or the structure 300, and with the remaining electrical elements, such as electronic components, in the structure 300.

Regarding the resulting overall thickness of the obtained electrical node 100, assembly such as the strip or sheet 200, and/or the multilayer structure 300, it depends e.g. on the used materials and related minimum material thicknesses providing the necessary strength in view of the manufacturing and subsequent use. These aspects have to be considered on case-by-case basis. For example, the overall thickness of the structure could be about 1 mm or a few millimeters, but considerably thicker or thinner embodiments are also feasible.

Further layers may be added, especially, to the structure 300 by lamination or suitable coating (e.g. deposition) procedure. The layers may be of protective, indicative and/or aesthetic value (graphics, colors, figures, text, numeric data, etc.) and contain e.g. textile, leather or rubber materials instead of or in addition to further plastics. Additional elements such as electronics may be installed at the outer surface(s) of the structure 300, such as the exterior surface of the substrate. A connector element for implementing e.g. electrical connection may be provided to the node 10 or structure 300 and connected to a desired external connection element such as external connector and/or connector cable of an external device, system or structure. For example, these two connectors may together form a plug-and-socket type connection.

In various additional or supplementary embodiments, e.g. the film 10 may comprise or consist of material(s) such as plastics, e.g. thermoplastic polymer, and/or organic or biomaterials with reference to e.g. wood, leather or fabric, or a combination of any of these materials with each other or with plastics or polymers or metals. The film 10 may comprise or consist of thermoplastic material. The film 10 may be essentially flexible or bendable. In some embodiments, the film 10 may alternatively be substantially rigid. The thickness of the film may vary depending on the embodiment; it may only be of few tens or hundreds of a millimeter, or considerably thicker, in the magnitude of one or few millimeter(s), for example.

The film 10 may, for example, comprise at least one material selected from the group consisting of: polymer, thermoplastic material, electrically insulating material, PMMA (Polymethyl methacrylate), Poly Carbonate (PC), copolyester, copolyester resin, polyimide, a copolymer of Methyl Methacrylate and Styrene (MS resin), glass, Polyethylene Terephthalate (PET), carbon fiber, organic material, biomaterial, leather, wood, textile, fabric, metal, organic natural material, solid wood, veneer, plywood, bark, tree bark, birch bark, cork, natural leather, natural textile or fabric material, naturally grown material, cotton, wool, linen, silk, and any combination of the above.

As alluded to hereinbefore, in various embodiments material(s) of the film 10 and/or of further layer(s) such as the second material layer 65 may at least partially be optically substantially opaque or at least translucent having regard to predefined wavelengths e.g. in visible spectrum. This is also applicable to the molded or cast material layer 90 as well as to the second substrate film 95, if any. The film 10 may have been provided with visually distinguishable, decorative/aesthetic and/or informative, features such as graphical pattern and/or color thereon or therein. The features may have been provided on the same side of the film with the electrical element 12 so that they have been also at least partially sealed, or on the opposite side and thus may or may not be sealed by the plastic material(s) through the associated overmolding procedure of the electrical node 100, for instance. Accordingly, IML (in-mold labeling)/IMD (in-mold decoration) technique is applicable. The used materials may be at least partially, i.e. at least in places, optically substantially transparent to radiation such as visible light emitted by the electronics thereon. The transmittance may be about 80%, 85%, 90%, 95% or higher, for example.

The molded material(s) may comprise thermoplastic and/or thermosetting material(s). Thickness of the molded or otherwise produced layer(s) may vary depending on the embodiment. It may be, for example, in the order of magnitude of less than one, one, few or tens of millimeters. E.g. the molded material may be e.g. electrically insulating.

In more detail, an included layer such as the second material layer 65 and/or e.g. layer 90 may comprise at least one material selected from the group consisting of: elastomeric resin, thermoset material, thermoplastic material, PC, PMMA, ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin.

In various additional or supplementary embodiments, a number of electrical elements 12, electrical connection elements 14 and/or electrical contact elements 16, such as pads, comprise at least one material selected from the group consisting of: conductive ink, conductive nanoparticle ink, copper, steel, iron, tin, aluminium, silver, gold, platinum, conductive adhesive, carbon fibre, alloy, silver alloy, zinc, brass, titanium, solder, and any component thereof. The used conductive materials may be optically opaque, translucent and/or transparent at desired wavelengths, such as visible light, so as to mask or let the radiation such as visible light to be reflected therefrom, absorbed therein or let through, for instance.

In various embodiments, selected features including also e.g. graphics, coloring or other visual features may be provided on internal surfaces or layers, e.g. on the side of a (substrate) film 10 that is facing the cavity 15 so that the features remain isolated and thus protected from potentially detrimental environmental effects at least by the thickness of the film 10 and potentially of surrounding protective layer 67, 90 of e.g. molded plastics 10. Accordingly, different impacts, rubbing, chemicals, etc. that could easily damage e.g. painted, printed or mounted surface features do not affect or reach the features. The film(s) may be easily manufactured or processed, optionally cut, into a desired shape with necessary characteristics such as holes or notches for exposing the underlying features such as material layers or e.g. electrical elements.

Figure 13:
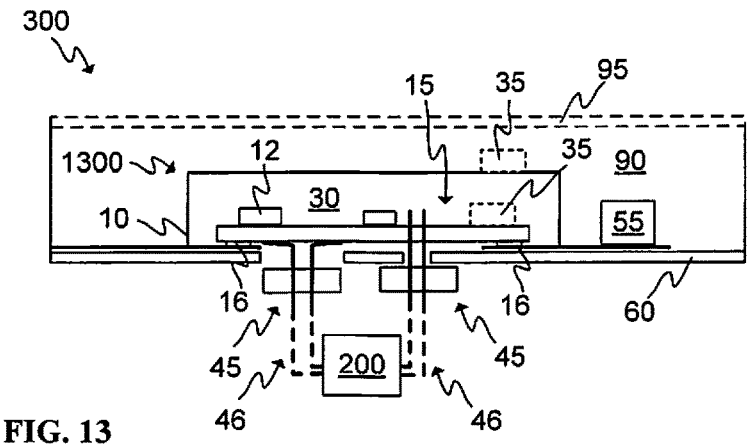
FIG. 13 illustrates an interface according to an embodiment of the present invention.

FIG. 13 illustrates, at 1300, an interface arrangement according to an embodiment of the present invention. The interface arrangement may optionally be or comprise an essentially electrical or specifically, electronic component, for instance, for providing connection between an external system 200 (comprising e.g. one or more external devices and/or structures) and a host structure 300 of the interface arrangement, preferably an IMSE structure, part or device, and e.g. various further, preferably electric or electronic, elements (circuits, components, etc.) 55 therein. The interface arrangement may comprise a first substrate film 10 defining a cavity 15, a first material layer 30 which may be arranged to at least partly fill the cavity 15, and to embed or at least partly cover at least one electrical element 12 arranged into the cavity 15, wherein the at least one electrical element 12 may comprise at least a converter element configured for adapting signals to be transferred between said external system 200 and electronics of the host structure 300. Furthermore, the interface may comprise a first connection element 45 preferably arranged at least partly into the cavity and configured for connecting to the external system 200, wherein the first connection element 45 is advantageously further connected at least functionally connected to the converter element.

In various embodiments, connection elements such as the first connection element 45 could comprise multiple portions or parts at least functionally such as electrically, if not also physically, connected together. In such case e.g. the first connection element 45 may comprise a part or portion (e.g. at least part of a mechanical connector) that is, to a considerable extent if not fully, provided outside the cavity, and at least one other part or portion that is at least partly located in the cavity 15 to connect the element 12, for example. The part or portion of the connection element 45 at least partly, if not completely, outside of the cavity 15 may be, for example, a connector part defining, for example, a male or female part of a USB such as USB 2.0 or 3.0 compliant connector while the part inside the cavity 15 may include electrical contacts to which said USB connector is connected and which are configured, such as including a suitable amount of conductors or conducting paths, for the signals received from or transmitted to said USB connector.

As can be easily deduced from FIG. 13, the interface arrangement may, preferably, be implemented by utilizing an embodiment of an electrical node 100 described hereinbefore with respect to e.g. any of FIGS. 1-10 and 18-19, and/or being illustrated in said figures. Additionally, the electrical node 100 when being used as or in an interface arrangement may at least comprise the aforementioned first connection element 45 preferably arranged at least partly into the cavity and configured for connecting to the external system 200, wherein the first connection element 45 may further be at least functionally, e.g. electrically, connected to, if not integrated with, the element 12, e.g. the converter element therein. Such internal connection may be carried out using a number of electrically conductive features such as conductor traces, pins and/or contacts.

In various embodiments, the first connector element 45 may generally comprise or define an electrical (electro-mechanical) connector, which may have e.g. a body or housing, and a number of connecting members, such as pins or receptacles (e.g. a socket with holes, the walls and/or bottom of which being provided with conductive material e.g. in the form of a coating) including electrically conductive material. In some embodiments, the body/housing may be omitted.

Particularly, in the embodiment shown in FIG. 13 the first connector element 45 comprises a male portion of a connector arranged in connection at least with the converter element. The male portion may be at least partly inside the cavity 15 or represent a part of the first connection element 45 completely outside the cavity 15, as contemplated hereinbefore. In FIG. 13, the male portion extends through the host substrate 60 of the host structure, such as through ready-made holes, or it may have been arranged by puncturing said portion through the host substrate 60 and to be in contact with at least some electrical element or electronic component, such as the converter element, of the interfacing arrangement.

A second connection element 16 may be provided and include e.g. a number of electrical contacts as discussed hereinbefore relative to various embodiments of electrical nodes for connecting to the electronics of the host structure 300. Also the second convection element 16 may be further be functionally, e.g. electrically, connected to the element 12, and e.g. the converter element therein, using suitable conductive features as mentioned above. Alternatively or additionally, the second connection element 16 may comprise a selected electrical connector, provided with e.g. a body and a number of electrically conductive connecting members such as pins or receptacles.

Item 46 refers to a connector or other connection element of the external system 200, compatible with the one 45 of the interface arrangement (e.g. plug-socket or male-female relationship, and/or communications-related compatibility).

The second connection element 16 may be connected to a further electric or electronic element(s) 55 arranged to the host structure or the multilayer structure 300, such as on the host substrate 60. The second connection element 16 may generally comprise or define an electrical (electro-mechanical) connector, which may have e.g. a body or housing, and a number of connecting members, such as pins or receptacles (e.g. a socket with holes, the walls and/or bottom of which being provided with conductive material e.g. in the form of a coating) including electrically conductive material. In some embodiments, the body/housing may be omitted.

FIG. 13 also illustrates a number of thermal management elements 35 which may be utilized in the interface arrangement such as described hereinbefore with respect to FIG. 3. The thermal management elements 35 may essentially be arranged to any electrical node 100 or arrangement as described herein, although not shown in all of the figures in favor of clarity.

Various embodiments of the interfacing arrangement may be utilized in variety of different technical fields. For example, for automotive use, a connection interface with surge arrestors and CAN or LIN may be utilized. In this case, at least three software-configurable control signals may be provided for generic compatibility (open-drain, pull-up/down, etc). The first connection element 45 of the interface arrangement may then be, for example, configured as comprising about ten wires or conductors along with suitable physical connector interface. Another example is to utilize USB, e.g. USB 2.0, compatible first connection element 45 comprising four wires including electrical power in addition to data transmitting. Still further example for HMIs and similar subsystem uses may be a software-configurable serial data interface: SPI comprises four wires, UART and I2C comprises two, although a single wire solution is also possible. According to one embodiment, the first connection element 45 comprises a connector comprising ten pins. Still further, an interface based on PoE may be implemented.

According to various embodiments, the interface arrangement may be configured to comprise a processing unit, and preferably other necessary components, such as memory, etc., to run a Transmission Control Protocol (TCP) or other suitable protocol for communication related functions, for example. Alternatively or additionally, connection may be based on a selected wireless technology in scenarios, such as for arranging power delivery and/or communication connections. Wireless communication techniques may be utilized in various embodiments of the arrangement, such as Bluetooth, a 802.11 (WLAN/WiFi) or NB-IoT.

The second communication element 16 may be very simple such as comprising at least one or two conductors or pins. In case UART is utilized the number of conductors or pins may be six.

Figure 14:
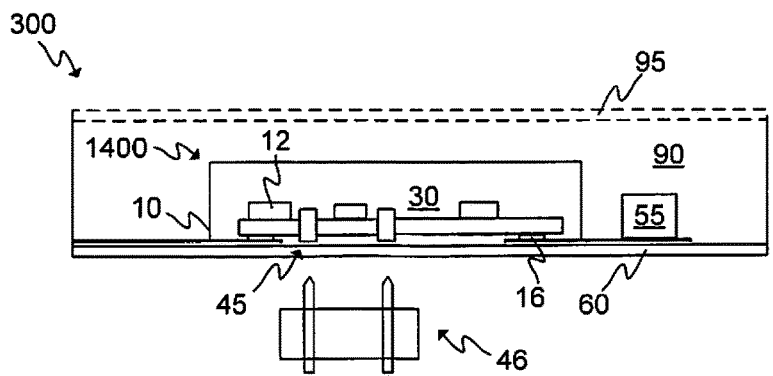
FIG. 14 illustrates an interface according to one other embodiment of the present invention.

FIG. 14 illustrates, at 1400, an interface arrangement according to an embodiment of the present invention. FIG. 14 illustrates corresponding elements of the interface arrangement as described already with respect to FIG. 13, however, the first connection element 45 comprises essentially a female portion of a connector (or the connector could be of hybrid male/female type). The first connection element 45 may in this case, preferably, be arranged completely inside the cavity 15, however, the female portion may also extend at least partly outside the cavity 15. The external system 200 (not shown, however see FIG. 13) may be connected to the multilayer structure 300 by a corresponding male portion of the connector, either through holes or by puncturing said portion through the host substrate 60 and to be in contact with at least some electrical element or electronic component, such as the converter element, of the interface arrangement. Furthermore, the interface arrangement 1400 may comprise, such as shown in and described in connection with FIG. 13, the converter element and a second connection element 16 which may be further connected to a further electric or electronic element(s) 55 arranged to the host structure or the multilayer structure 300, such as on the host substrate 60.

Figure 15:
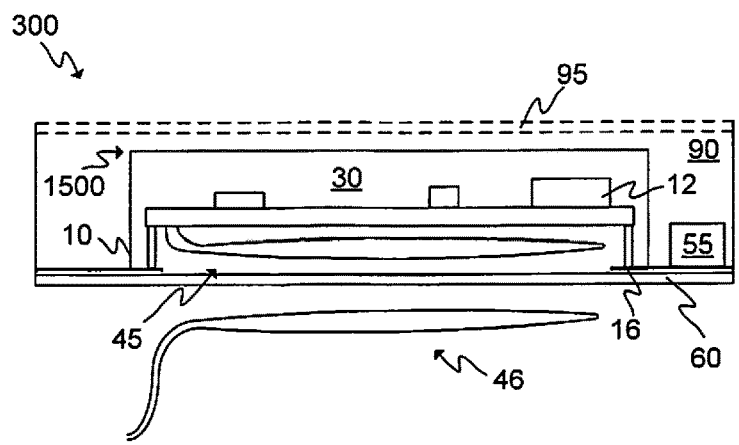
FIG. 15 illustrates an interface according to a further embodiment of the present invention.

FIG. 15 illustrates, at 1500, an interface arrangement according to an embodiment of the present invention. FIG. 15 illustrates corresponding elements of the interface arrangement as described already with respect to e.g. FIG. 13, however, the first connection element 45 comprises a coil. The coil may preferably be configured to establish an electromagnetic connection with another coil or magnetic element of the external system 200, for instance. The first connection element 45 may, therefore, be such that it enables transmitting power and/or establishing communication connection wirelessly to and/or from the external system 200. The first connection element 45 may in this case, preferably, be arranged completely inside the cavity 15, however, it may alternatively be arranged at least partly outside the cavity 15, such as on the side of the second substrate 20 facing away from the first material layer 30. The coil may be connected to the converter element for converting the induced voltages and/or currents to a suitable signal or signals in order to be utilized in the host structure or the multilayer structure 300, such as in a further electric or electronic element(s) 55. The external system 200 (not shown, however, see FIG. 13) may thus be connected to the multilayer structure 300 by a corresponding coil or other magnetic element, for example, through the host substrate 60.

Figure 16:
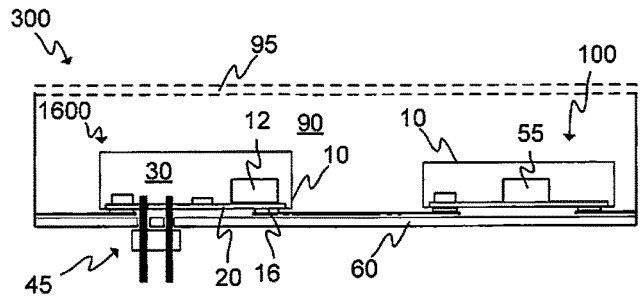
FIG. 16 illustrates an interface according to a still further embodiment of the present invention.

FIG. 16 illustrates, at 1600, an interface arrangement according to an embodiment of the present invention. FIG. 16 illustrates corresponding elements of the interface arrangement as described already with respect to e.g. FIG. 13. However, the multilayer structure 300 may comprise, in addition to the interface arrangement, an electrical node 100 which is preferably connected to the interface arrangement, such as to the second connection element 16. Still further, the further electric or electronic element(s) 55 may be, however not necessarily, arranged to be inside an embodiment of the electrical node 100.

Figure 17:
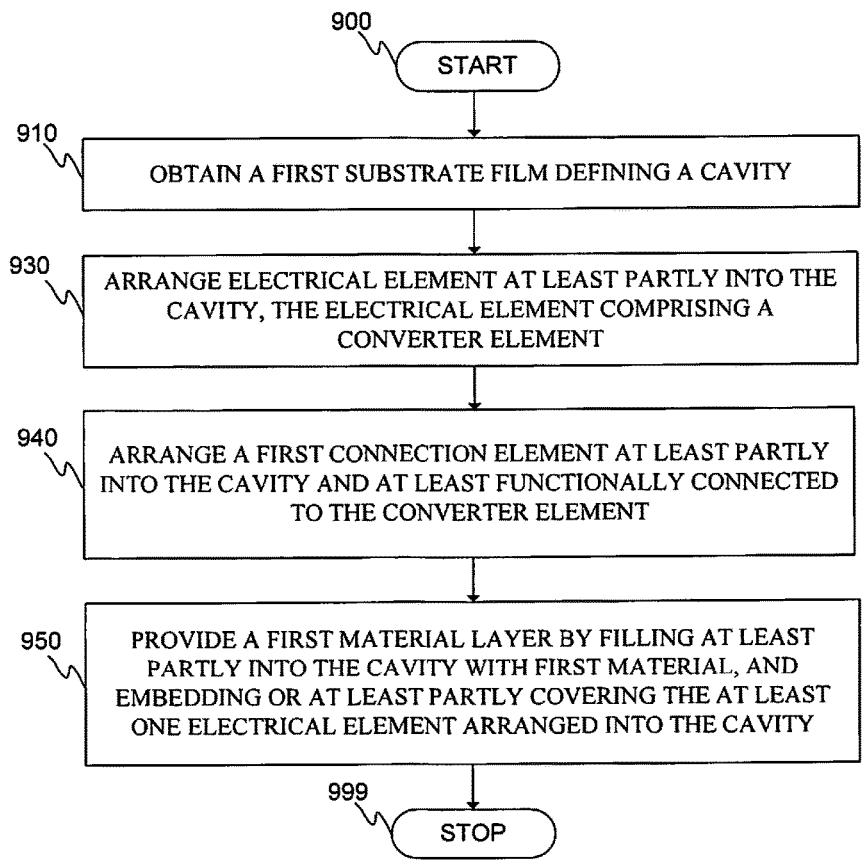
FIG. 17 illustrates a flow diagram of a method according to an embodiment of the present invention.

FIG. 17 illustrates a flow diagram of a method according to an embodiment of the present invention. The embodiment may be considered to particularly address interfacing applications in contrast to more general embodiment of FIG. 11. However, various details and applicable design principles contemplated in connection with the description of FIG. 11, are also applicable here, and vice versa mutatis mutandis. At the beginning of the method for manufacturing an interfacing (i.e. interface) arrangement 1300, 1400, 1500, 1600, a start-up phase 900 may be executed. During start-up, the necessary tasks such as material, for example substrates, component and tools selection, acquisition, calibration and other configuration tasks may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding/IMD (in-mold decoration), lamination, bonding, (thermo)forming, electronics assembly, cut-ting, drilling and/or printing equipment, among others, may be thus ramped up to operational status at this stage.

At 910, a first substrate film 10 defining a cavity 15 may be obtained. According to an embodiment, the first substrate film 10 may be obtained by forming, such as thermoforming, cold-forming or utilizing vacuum or high pressure, an initial substrate film to define the cavity 15. According to another alternative or additional embodiment, the first substrate film 10 may be obtained by molding, such as injection molding, optionally directly in its target three-dimensional shape containing the cavity 15.

At 930, at least one electrical element may be arranged at least partly into the cavity, wherein the at least one electrical element comprises at least a converter element configured for adapting signals to be transferred between said external system and electronics of the host structure.

At 940, a first connection element, optionally comprising a first electro-mechanical connector or wireless connection element, configured for connecting to the external system may be arranged, preferably at least partly into the cavity, said first connection element further being at least functionally connected to the converter element; and At 950, a first material layer may be provided by filling at least partly the cavity with a first material, and embedding or at least partly covering the at least one electrical element arranged into the cavity.

In some embodiments, the method may comprise arranging a second connection element 16 to the interface arrangement. The second connection element 16 may be at least functionally, and optionally physically, connected to the converter element. The second connection element 16 may be configured or adapted for attaching to the host structure, such as to the host substrate 60. According to various embodiments, the second connection element 16, one or several, may be arranged at a peripheral portion of the first substrate film 10.

In some embodiments, the method may comprise printing, such as screen printing or inkjet printing, or other forms of printed electronics technology, at least portion of the at least one electrical element 12 on the first substrate film 10 and into the cavity 15, that is, on a portion of the first substrate film 10 forming the inner surface of the cavity 15. Alternatively or additionally, a number of further features such as the second connection element 16 may be obtained by printed electronics technology.

In some embodiments, the method may comprise obtaining a second substrate 20, such as a printed circuit board, comprising the at least one electrical element 12, such as a part or parts of the converter element or other electrical elements, and arranging the second substrate 20 so that the at least one electrical element 12 is positioned into the cavity 15 so that the at least one electrical element 12 is embedded or at least partly covered by the first material layer 30.

In various embodiments, a number of conductive areas defining e.g. conductor lines (traces) and/or contact pads and/or electrodes to construct a circuit design are provided on the film(s), either or both sides thereof, preferably by one or more additive techniques of printed electronics technology. For example, screen, inkjet, flexographic, gravure or offset lithographic printing may be utilized. Also further actions cultivating the film(s) involving e.g. printing or generally provision of graphics, visual indicators, optical elements, etc. thereon may take place here. Accordingly, also a number of electrically non-conductive or insulating features may be provided preferably by printed electronics technology in the concerned structure.

At 999, method execution is ended.

Figure 18:
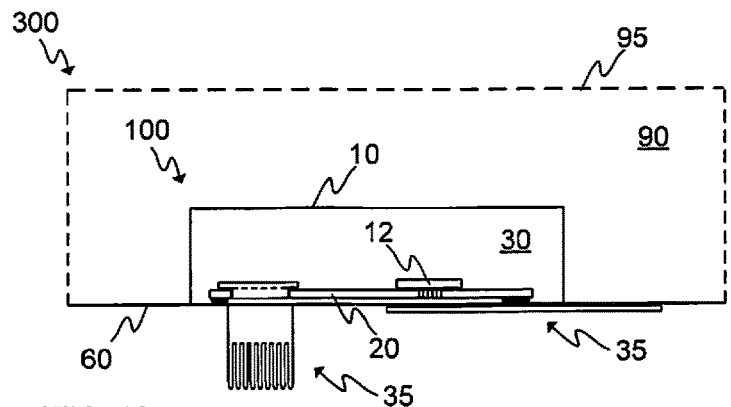
FIG. 18 illustrates schematically a further embodiment of the electrical node, provided with a number of applicable thermal management features.

FIG. 18 illustrates schematically a further embodiment of the electrical node 100, provided with a number of applicable thermal management features, such as elements 35. In FIG. 18, a thermal management element 35 may comprise a heat sink which may be arranged at least partly, such as having a minor portion thereof, or about or over fifty, sixty, seventy, eighty or ninety percent of the element (e.g. volume, area and/or weight), outside the cavity 15 and/or the electrical node 100. However, in various embodiments in accordance with the one schematically shown in FIG. 18, the heat sink may be at least partly inside the node 100 and/or specifically the cavity 15. There may, preferably, be a thermal conduction path, such as through an opening in the host substrate 60 and/or the second substrate 20, if any, between the thermal management element 35 and electrical elements, such as the at least one electrical element 12 or the converter element, which are arranged into the cavity 15 and generate heat. The thermal conduction path may additionally or alternatively comprise thermal conductive paste and/or thermally conductive parts or layers essentially arranged in contact with each other to form the path. In various embodiments, thermal and electrical conduction paths may be at least partially arranged by at least one common element in addition to or instead of dedicated elements, such as a connector or conductor comprising e.g. selected metal and/or other material, conducting both heat and electricity.

In various embodiments, the thermal management element 35 may be arranged on the opposite side of the cavity 15 with respect to the closed side or the top side of the cavity 15 when looking at FIG. 18. In other words, the thermal management element 15 may preferably be arranged on the open side of the cavity 15 such as in FIG. 18. Parts of the thermal conduction path may reside in the node 100 or the cavity 15, such as for conductive heat along the second substrate 20, if any. Furthermore, there may be thermally conductive material, e.g. graphite or copper, such as pieces of graphite or copper tape, arranged on the host substrate 60 and/or on an outer surface of the node 100. The tape may be arranged, for example, on the same side of the node 100 or the interface arrangement as the open side of the cavity 15 of the first substrate film 10.

Figure 19:
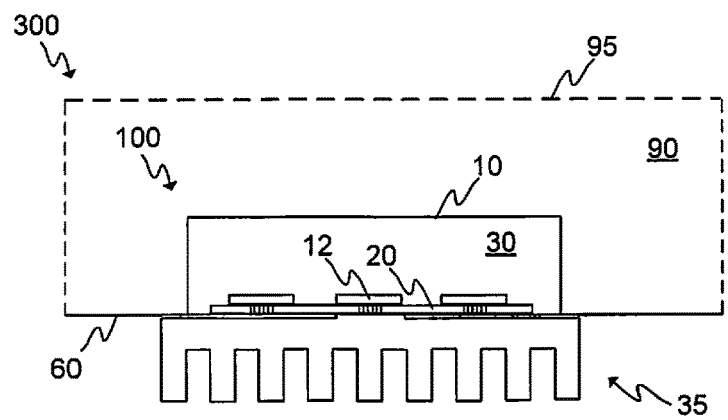
FIG. 19 illustrates schematically still a further embodiment of the electrical node, provided with a number of related thermal management features.

FIG. 19 illustrates schematically still a further embodiment of the electrical node 100, provided with a number of related thermal management features, such as elements 35.

In FIG. 19, the thermal management element 35 may be arranged by injection molding with thermally conductive material. Such a thermal management element 35 may be provide by a two-shot molding technique. There may, preferably, be an opening, such as a cut or the hole or through-hole in the host substrate 60 and/or the second substrate 20, if any, so that the material of the thermal management element 35, such as of a heat sink or a heat pipe, becomes molded close to the heat generating element of the node 100.

Figure 20:
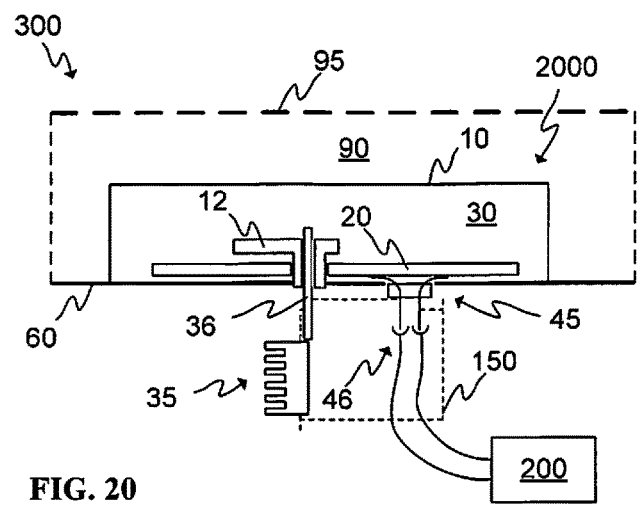
FIG. 20 illustrates various applicable aspects of thermal management in connection with an embodiment of the interface according to the present invention.

FIG. 20 illustrates various applicable aspects of thermal management in connection with an embodiment of the interface arrangement, at 2000, according to the present invention. The interface arrangement or the node 100 of FIG. 20 may comprise a first connection element 45 and a connector 46 or other connection element of the external system 200, compatible with the one 45 of the interface arrangement. The arrangement may further comprise a number of thermal management elements 35, 36 such as a heat sink and a heat pipe at least in thermal if not physical connection with the heat sink, which could further be considered to at least functionally establish a multi-part thermal management element. The heat pipe may preferably be arranged through the host 60 and/or the second substrate 20, if any. In FIG. 20, the heat sink is outside the node 100, that is the interface node, while the heat pipe is arranged at least partly into the node.

In some embodiments, the thermal management element 35 may comprise a heat sink which has been arranged e.g. into a housing 150 of any one or more of the connectors 45, 46. This is illustrated in FIG. 20. The heat sink may, preferably, be connected through a thermally conductive path, such as comprising a heat pipe, to an electrical element in the node 100 and/or the cavity 15. This may be an advantageous arrangement for cooling a high-power component inside the node 100, such as an amplifier or laser component. The heat sink or other thermal management element may further be coolable by cooling fluid such as air or liquid, such as water. Therefore, at least one connector 45 of the interface arrangement may be a hybrid thermal/electrical connector.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario. For instance, instead of or in addition to molding the plastics directly onto the substrate 60, a plastic layer could be prepared upfront and then attached to the substrate by suitable lamination technique applying e.g. adhesive, mechanical attachment means (screws, bolts, nails, etc.), pressure and/or heat. Finally, in some scenarios, instead of molding or casting, the plastic or other layer could be produced on the target substrate(s) using a suitable deposition or further alternative method. Yet, instead of printed, (electrically) conductive traces, the traces could be produced/provided otherwise. E.g. a conductor film manufactured utilizing etching or transfer lamination, among other options, could be applied.

The invention claimed is:

1. An interface arrangement for providing electrical or electromagnetic connection between an external system and a host structure of the interface arrangement, the interface arrangement comprising:
   a first substrate film defining a cavity;
   a first material layer arranged to at least partly fill the cavity, and to embed or at least partly cover at least one electrical element at least partly arranged into the cavity, wherein the at least one electrical element comprises at least a converter element configured for adapting signals to be transferred between the external system and electronics of the host structure; and
   a first connection element configured for connecting to the external system, wherein the first connection element is further at least functionally connected to the converter element.

2. The interface arrangement according to claim 1, comprising at least one second connection element arranged for connecting to the host structure and at least functionally connected to the converter element.

3. The interface arrangement according to claim 1, comprising the at least one electrical element being at least partially printed on the first substrate film and into the cavity.

4. The interface arrangement according to claim 1, wherein the adapting comprises at least one element selected from the group consisting of: signal transformation, voltage conversion, current conversion, power conversion, power conditioning, signal path adaptation, signal path migration, signal path connecting, signal path separation, signal selection, signal amplification, signal attenuation, voltage limiting, current limiting, and signal filtering.

5. The interface arrangement according to claim 1, wherein the signals comprise at least one element selected from the group consisting of: electrical signal, electromagnetic signal, optical signal, current, voltage, power signal, analogue signal, digital signal, control signal, and data signal.

6. The interface arrangement according to claim 1, further comprising a second substrate comprising one or more electrical elements of the at least one electrical element, wherein the second substrate is arranged so that the one or more electrical elements of the at least one electrical element is positioned into the cavity and embedded in or at least partly covered by the first material layer.

7. The interface arrangement according to claim 1, comprising a second material layer arranged on the at least one electrical element for reducing air pockets between the at least one electrical element and the first material layer.

8. The interface arrangement according to claim 1, wherein the at least one electrical element comprises at least one element selected from the group consisting of: signal filtering element, protection circuit element, regulator, power supply, SMPS power supply, switch, power receiving coil, power transferring coil, coil, inductor, amplifier, attenuator, integrated circuit, processing unit, microcontroller, microprocessor, signal processor, logic array, logic chip, programmable logic, capacitor, and input capacitor.

9. The interface arrangement according to claim 1, wherein the first connection element comprises an electromechanical connector.

10. The interface arrangement according to claim 1, wherein the first connection element comprises a wireless connection element.

11. The interface arrangement according to claim 1, wherein the first connection element comprises:
   a first portion which at least partially resides or extends outside the cavity in order to face and connect with a compatible connection member of the external system; and
   a second portion configured to at least functionally establish the connection between the first portion and the converter element, wherein the second portion is at least partly arranged to or extending to the cavity.

12. The interface arrangement according to claim 1, wherein the converter element/or the first connection element is adapted for providing wired connectivity based on at least one wired connecting or communication technique or technology selected from the group consisting of: CAN, LIN, USB 3.0, USB 2.0, USB, HMI, SPI, UART or asynchronous serial communication, I2C, LAN, Ethernet, and PoE.

13. The interface arrangement according to claim 1, wherein the converter element/or the first connection element is adapted for providing wireless connectivity based on at least one wireless connecting or communication technique or technology selected from the group consisting of: BlueTooth, WLAN/WiFi, and NB-IoT.

14. The interface arrangement according to claim 1, wherein the first substrate film is a formed substrate film or an injection molded substrate film defining the cavity.

15. The interface arrangement according to claim 1, comprising a thermal management element selected from the group of: a heat sink, a thermal slug, and a thermal well.

16. A method for manufacturing an interface arrangement configured to provide connection between an external system and a host structure of the interface arrangement, the method comprising:
   obtaining a first substrate film defining a cavity;
   arranging at least one electrical element at least partly into the cavity, wherein the at least one electrical element comprises at least a converter element configured for adapting signals to be transferred between the external system and electronics of the host structure;

arranging a first connection element configured for connecting to the external system, the first connection element further being at least functionally connected to the converter element; and providing a first material layer by filling at least partly the cavity with a first material, and embedding or at least partly covering the at least one electrical element arranged into the cavity.

17. The method according to claim 16, comprising arranging a second connection element configured to connect to the host structure into at least functional connection with the converter element.

18. A multilayer structure comprising a host substrate configured to host electronics and an interface arrangement arranged to provide connection between an external system and the electronics of the multilayer structure, the interface arrangement comprising:
a first substrate film defining a cavity;
a first material layer arranged to at least partly fill the cavity, and to embed or at least partly cover at least one electrical element at least partly arranged into the cavity, wherein the at least one electrical element comprises at least a converter element configured for adapting signals to be transferred between the external system and the multilayer structure; and
a first connection element configured for connecting to the external system, wherein the first connection element is at least functionally connected to the converter element; and
wherein the multilayer structure further comprises a molded or cast material layer at least partly embedding or covering the first substrate film arranged onto the host substrate.

19. The multilayer structure according to claim 18, comprising a second connection element attached to the host substrate for providing connection to the host substrate and at least functionally connected to the converter element.

20. The multilayer structure according claim 18, wherein the electronics comprises at least one electrical or electronic component arranged on the host substrate, wherein the component is at least functionally connected to the converter element via a second connection element of the interface arrangement.

\* \* \* \* \*